US012811547B2

(12) United States Patent
Kim et al.

(10) Patent No.: US 12,811,547 B2
(45) Date of Patent: Nov. 24, 2026

(54) DUAL-MODE POWER AMPLIFIER AND METHOD

(71) Applicant: Industry-University Cooperation Foundation Hanyang University Erica Campus, Ansan-si (KR)

(72) Inventors: Jung Hyun Kim, Ansan-si (KR); Sungwoon Hwang, Ansan-si (KR); Sungyoon Kang, Siheung-si (KR); Sooji Bae, Ansan-si (KR); Byeongcheol Yoon, Ansan-si (KR)

(73) Assignee: Industry-University Cooperation Foundation Hanyang University Erica Campus, Ansan-si (KR)

( * ) Notice: Subject to any disclaimer, the term of this patent is extended or adjusted under 35 U.S.C. 154(b) by 385 days.

(21) Appl. No.: 18/685,515

(22) PCT Filed: Oct. 25, 2022

(86) PCT No.: PCT/KR2022/016311

§ 371 (c)(1),
(2) Date: Feb. 22, 2024

(87) PCT Pub. No.: WO2023/075344

PCT Pub. Date: May 4, 2023

(65) Prior Publication Data

US 2024/0356498 A1 Oct. 24, 2024

(30) Foreign Application Priority Data

Oct. 25, 2021 (KR) ........................ 10-2021-0142472
May 25, 2022 (KR) ........................ 10-2022-0063815
Sep. 14, 2022 (KR) ........................ 10-2022-0115260

(51) Int. Cl.
*H03F 3/00* (2006.01)
*H03F 1/56* (2006.01)
(Continued)

(52) U.S. Cl.
CPC ............... *H03F 1/56* (2013.01); *H03F 3/211* (2013.01); *H03F 3/213* (2013.01); *H03F 2200/387* (2013.01); *H03F 2200/541* (2013.01)

(58) Field of Classification Search
CPC . H03F 1/56; H03F 3/211; H03F 3/213; H03F 2200/387; H03F 2200/541;
(Continued)

(56) References Cited

U.S. PATENT DOCUMENTS 7,728,661 B2 6/2010 Bockelman et al.
8,269,555 B2 9/2012 Van Der Heijden et al.
(Continued)

FOREIGN PATENT DOCUMENTS

CN 102017400 A 4/2011
CN 102124645 A 7/2011
(Continued)

*Primary Examiner* — Tuan T Lam

(74) *Attorney, Agent, or Firm* — NKL Law; Jae Youn Kim

(57) ABSTRACT

The present disclosure relates to a dual-mode power amplifier, there is disclosed a dual-mode power amplifier that can selectively operate in a low-power mode for low output and a high-power mode for high output, the dual-mode power amplifier including a high-power amplifier comprising one or more transistors whose operations are controlled by a first bias; a first transformer connected in series to an output stage of the high-power amplifier; a low-power amplifier comprising one or more transistors whose operations are controlled by a second bias; and a second transformer connected in series to an output stage of the low-power amplifier, wherein the dual-mode power amplifier operates in a high-power mode when the first bias is activated and the second bias is deactivated, and operates in a low-power mode when the first bias is deactivated and the second bias is activated.

19 Claims, 18 Drawing Sheets

$$Z_{in} = r_b + r_e + \frac{z_\pi}{1 + g_m z_\pi}$$

$$Z_{out} = r_c + r_e + \frac{1}{jwC_c} + \frac{z_\pi}{1 + g_m z_\pi}\left[1 - \frac{g_m}{jwC_c}\right]$$

(51) Int. Cl.
*H03F 3/21* (2006.01)
*H03F 3/213* (2006.01)

(58) Field of Classification Search
CPC . H03F 1/565; H03F 3/245; H03F 3/72; H03F 2200/537; H03F 2203/7206; H03F 1/0277; H03F 3/195
See application file for complete search history.

(56) References Cited

U.S. PATENT DOCUMENTS

| | | | | |
|---|---|---|---|---|
| 8,749,305 | B2 | 6/2014 | Retz et al. | |
| 9,306,502 | B2 | 4/2016 | Chan | |
| 9,991,853 | B2 | 6/2018 | Kang et al. | |
| 11,057,008 | B2 * | 7/2021 | Shao | H03F 3/193 |
| 11,716,056 | B2 * | 8/2023 | Dinc | H03F 1/02 330/252 |
| 11,996,811 | B2 * | 5/2024 | Kazuno | H03F 3/26 |
| 2009/0273397 | A1 * | 11/2009 | Bockelman | H03F 3/211 330/195 |
| 2011/0051842 | A1 | 3/2011 | Van Der Heijden et al. | |
| 2012/0286875 | A1 | 11/2012 | Chan | |
| 2015/0194842 | A1 * | 7/2015 | Mondal | H02J 1/10 307/23 |
| 2017/0126185 | A1 | 5/2017 | Kang et al. | |
| 2021/0167736 | A1 * | 6/2021 | Kim | H03F 3/211 |

FOREIGN PATENT DOCUMENTS

| | | | |
|---|---|---|---|
| CN | 102017400 | B | 7/2013 |
| CN | 103650336 | A | 3/2014 |
| CN | 105515534 | A | 4/2016 |
| CN | 103650336 | B | 2/2017 |
| CN | 106656068 | A | 5/2017 |
| CN | 106656068 | B | 8/2020 |
| EP | 2274829 | B1 | 9/2012 |
| EP | 2707948 | A2 | 3/2014 |
| EP | 2707948 | B1 | 7/2015 |
| JP | 2014517597 | A | 7/2014 |
| JP | 5852229 | B2 | 2/2016 |
| KR | 19950006535 | A | 12/1995 |
| KR | 100806298 | B1 | 2/2008 |
| KR | 20080059469 | A | 6/2008 |
| KR | 20110003574 | A | 1/2011 |
| KR | 101234957 | B1 | 2/2013 |
| KR | 20130104639 | A | 9/2013 |
| KR | 20140013068 | A | 2/2014 |
| KR | 20140077598 | A | 6/2014 |
| KR | 101695337 | B1 | 1/2017 |
| KR | 101719310 | B1 | 3/2017 |
| KR | 101881767 | B1 | 7/2018 |
| KR | 20210014358 | A | 2/2021 |
| WO | 2009136326 | A1 | 11/2009 |
| WO | 2009137160 | A2 | 11/2009 |
| WO | 2012154840 | A2 | 11/2012 |
| WO | 2012154840 | A3 | 4/2013 |

* cited by examiner

-- Prior Art--

$$Z_{in} = r_b + r_e + \frac{z_\pi}{1 + g_m z_\pi}$$

$$Z_{out} = r_c + r_e + \frac{1}{jwC_c} + \frac{z_\pi}{1 + g_m z_\pi}\left[1 - \frac{g_m}{jwC_c}\right]$$

| Mode | $L_p$ (nH) | $L_S$ (nH) | $Q_p$ | $Q_S$ | k | n | IL (dB) | $C_p$ (pF) | $C_p$ (pF) |
|---|---|---|---|---|---|---|---|---|---|
| High power | 0.38 | 1 | 59 | 67 | 0.74 | 1.6 | 0.18 | 0.4 | 0.4 |
| Low power | 3.1 | 2.4 | 36 | 40 | 0.67 | 0.87 | 0.31 | - | |

DUAL-MODE POWER AMPLIFIER AND METHOD

FIELD OF THE INVENTION

The present disclosure relates to a dual-mode power amplifier and method.

BACKGROUND ART

In designing a power amplifier for a front-end module for LTE and 5G mobile communications, in some cases, a dual-mode power amplifier is adopted to extend battery life.

In the case of a dual-mode power amplifier, it is divided into high-power and low-power amplifiers, and a switch is generally used to isolate the two amplifiers, as shown in FIG. 1. However, there are various problems in implementing a switch, the biggest problem being the size to implement the switch. Power amplifiers for mobile communications are mainly designed using an InGaP/GaAs HBT process, but there are two ways to implement an RF switch: InGaP/GaAs HBT or CMOS.

When the switch is implemented with the InGaP/GaAs HBT process, the same process as the power amplifier is used, but there are problems with high loss and the need for additional circuitry for switch on/off bias. This requires an additional HBT size, causing problems with the overall system and MMIC size.

When a switch is implemented using the CMOS process, a space is needed to connect an additional switch that can be implemented in a module assembly unit. It cannot be highly competitive in the communication components market, where an increase in size in micro-meter units may be a major problem in market competition.

Accordingly, demand is increasing for dual-mode power amplifiers that improve efficiency through ensuring that the high-power amplifier and the low-power amplifier operate independently while solving a space problem that arises when using a switch.

PRIOR ART LITERATURE

Patent Literature (Patent literature 0001) Korean Patent Registration No. 10-1695337 ("System Providing Switchable Impedance Transformer Matching for Power Amplifiers", disclosed to the public on Feb. 4, 2014)

DETAILED DESCRIPTION OF THE INVENTION

Technical Problem

An aspect of the present disclosure is to provide a dual-mode power amplifier and method that provides impedance matching to a high-power amplifier when operating in a high-power mode and provides impedance matching to a low-power amplifier when operating in a low-power mode.

Technical Solution

In order to solve the foregoing problems, a dual-mode power amplifier and method is provided.

In a dual-mode power amplifier that can selectively operate in a low-power mode for low output and a high-power mode for high output, the dual-mode power amplifier may include a high-power amplifier comprising one or more transistors whose operations are controlled by a first bias; a first transformer connected in series to an output stage of the high-power amplifier; a low-power amplifier comprising one or more transistors whose operations are controlled by a second bias; and a second transformer connected in series to an output stage of the low-power amplifier, wherein the dual-mode power amplifier operates in a high-power mode when the first bias is activated and the second bias is deactivated, and operates in a low-power mode when the first bias is deactivated and the second bias is activated.

The dual-mode power amplifier may further include an input transformer, wherein the high-power amplifier is connected in series to an output stage of the input transformer, and the low-power amplifier is connected in series to an output stage of the input transformer.

When operating in the high-power mode, the first transformer may provide impedance matching to the high-power amplifier, and the second transformer may provide an impedance with an infinite value to the low-power amplifier.

When operating in the low-power mode, the second transformer may provide impedance matching to the low-power amplifier, and the first transformer may provide an impedance with an infinite value to the high-power amplifier.

An inductance of a primary coil of the second transformer may be determined by a series equivalent capacitor by which a parasitic capacitance of the low-power amplifier is replaced, and an inductance of a primary coil of the first transformer may be determined by a series equivalent capacitor by which a parasitic capacitance of the high-power amplifier is replaced.

The inductance of the primary coil of the second transformer may be calculated using the following equation.

$$L_{p2} = \frac{1}{\omega^2 C_{eq2}}$$

Here, $L_{p2}$ is an inductance of the primary coil of the second transformer, ω is a frequency, and $C_{eq2}$ is a series equivalent capacitor by which the parasitic capacitance of the low-power amplifier is replaced.

The inductance of the primary coil of the first transformer may be calculated using the following equation.

$$L_{p1} = \frac{1}{\omega^2 C_{eq1}}$$

Here, $L_{p1}$ is an inductance of the primary coil of the first transformer, and $C_{eq2}$ is a series equivalent capacitor by which the parasitic capacitance of the high-power amplifier is replaced.

When operating in the high-power mode, an impedance seen from the high-power amplifier to the amplifier output stage may be determined by an inductance of the primary coil of the first transformer, and an impedance seen from the amplifier output stage to the low-power amplifier may be determined by an inductance of a secondary coil of the second transformer.

The secondary coil inductance of the second transformer may be determined in a direction of increasing a magnitude of impedance seen from the amplifier output stage to the low-power amplifier when operating in the high-power mode.

When operating in the low-power mode, an impedance seen from the low-power amplifier to the amplifier output stage may be determined by an inductance of the primary coil of the second transformer, and an impedance seen from the amplifier output stage to the high-power amplifier may be determined by an inductance of a secondary coil of the first transformer.

The secondary coil inductance of the first transformer may be determined in a direction of increasing a magnitude of impedance seen from an output stage of the first transformer to the high-power amplifier when operating in the low-power mode.

The dual-mode power amplifier may further include a first front-end capacitor connected in parallel to a front end of the first transformer; a first rear-end capacitor connected in parallel to a rear end of the first transformer; a second front-end capacitor connected in parallel to a front end of the second transformer; and a second rear-end capacitor connected in parallel to a rear end of the second transformer, wherein the first rear-end capacitor and the second rear-end capacitor share the same capacitor.

When operating in the high-power mode, an impedance seen from the high-power amplifier to the amplifier output stage may be determined by further including a capacitance of the first front-end capacitor, and an impedance seen from the amplifier output stage to the low-power amplifier may be determined by further including a capacitance of the second rear-end capacitor.

When operating in the low-power mode, an impedance seen from the low-power amplifier to the amplifier output stage may be determined by further including a capacitance of the second front-end capacitor, and an impedance seen from the amplifier output stage to the high-power amplifier may be determined by further including a capacitance of the first rear-end capacitor.

When operating in the high-power mode, the high-power amplifier may adjust a turns ratio of the first transformer and an inductance of the primary coil of the first transformer to match an impedance seen from the high-power amplifier to the amplifier output stage with a load, and the low-power amplifier may adjust an inductance of the primary coil of the second transformer to minimize an imaginary component of the impedance of the low-power amplifier, and generate an infinite impedance seen from the amplifier output stage to the low-power amplifier.

When operating in the low-power mode, the high-power amplifier may adjust an inductance of the primary coil of the first transformer to minimize an imaginary component of the impedance of the high-power amplifier and generate an infinite impedance seen from the amplifier output stage to the high-power amplifier, and the low-power amplifier may adjust a turns ratio of the second transformer and an inductance of the primary coil of the second transformer to match an impedance seen from the low-power amplifier to the amplifier output stage with a load.

When operating in the high-power mode, an output impedance of the high-power amplifier may move from an impedance seen from the secondary coil of the first transformer to the amplifier output stage toward an impedance seen from the primary coil of the first transformer to the amplifier output stage.

When operating in the low-power mode, for the second transformer, an output impedance of the low-power amplifier may move from an impedance seen from the secondary coil of the second transformer to the amplifier output stage toward an impedance seen from the primary coil of the second transformer to the amplifier output stage.

The high-power amplifier and the low-power amplifier may be implemented in a single MMIC using an InGaP/GaAs HBT process.

The first transformer and the second transformer may be implemented as a microstrip pattern around the MMIC on a PCB on which the MMIC is mounted.

Advantageous Effects

According to the foregoing dual-mode power amplifier and method, it may be configured such that an impedance is matched to a high-power amplifier and an impedance close to infinity is shown at a low-power amplifier when operating in a high-power mode, and an impedance is matched to a low-power amplifier and an impedance close to infinity is shown at a high-power amplifier when operating in a low-power mode, thereby achieving a maximum output.

BEST MODE FOR CARRYING OUT THE INVENTION

Figure 1:
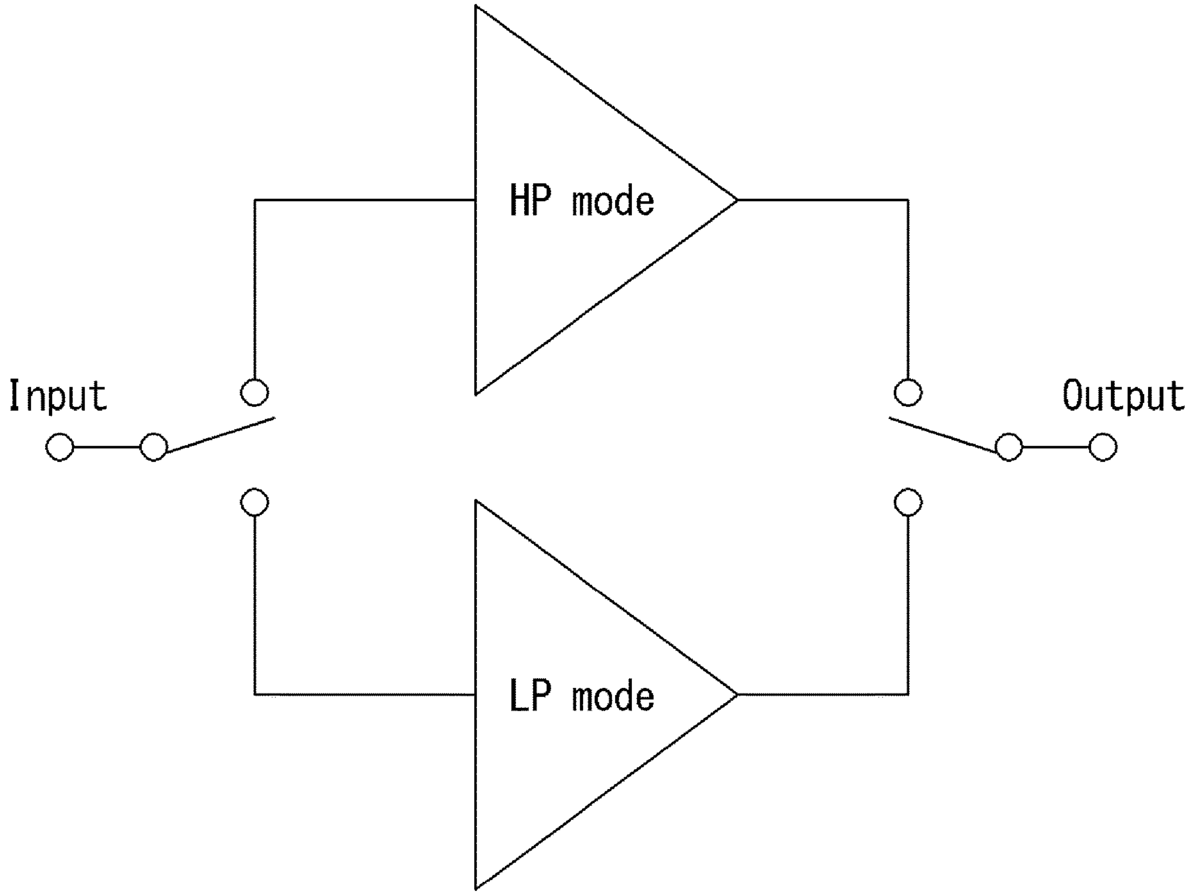
FIG. 1 is a circuit diagram of a dual-mode power amplifier using a conventional switch.

Advantages and features of the present disclosure, and methods of accomplishing the same will be clearly understood with reference to embodiments described below in conjunction with the accompanying drawings. However, the present disclosure is not limited to those embodiments disclosed below but may be implemented in various different forms. It should be noted that the present embodiments are merely provided to make a full disclosure of the invention and also to allow those skilled in the art to know the full range of the invention, and therefore, the present disclosure is to be defined only by the scope of the appended claims.

Terms used herein will be briefly described, and the present disclosure will be described in detail.

Although the terms used in the present disclosure are selected from generally known and used terms considering their functions in the present disclosure, the terms may be modified depending on intention of a person skilled in the art, practices, or the advent of new technology. Besides, in a specific case, some terms may be arbitrarily chosen by the present applicant, and in this case, the meanings of those terms will be described in corresponding parts of the present disclosure in detail. Accordingly, the terms used herein should be understood not simply by the actual terms used but by the meaning lying within and the description disclosed herein.

Throughout the specification, when a portion may "include" a certain element, unless specified otherwise, it may not be construed to exclude another element but may be construed to further include other elements. Moreover, terms described in the specification such as "part," "module," and "unit," refer to a unit of processing at least one function or operation, and may be implemented by software, a hardware element such as a field-programmable gate array (FPGA) or an application-specific integrated circuit (ASIC), or a combination of software and hardware. However, the terms "part," "module," "unit," and the like are not limited to software or hardware. "Part," "module," "unit," and the like may be configured in a recording medium that can be addressed or may be configured to be reproduced on at least one processor. Therefore, examples of the terms "part," "module," "unit," and the like include software elements, object-oriented software elements, elements such as class elements and task elements, processes, functions, properties, procedures, subroutines, segments in program codes, drivers, firmware, microcode, circuits, data, databases, data structures, tables, arrays, and variables.

Hereinafter, embodiments of the present disclosure will be described in detail with reference to the accompanying drawings so as to be easily implemented by those skilled in the art. In addition, parts irrelevant to description will be omitted in the drawings in order to clearly describe the present disclosure.

The terms including an ordinal number such as "first," "second," and the like may be used to describe various elements, but the elements should not be limited by those terms. The terms are used merely for the purpose to distinguish an element from the other element. For example, a first element may be named to a second element, and similarly, a second element may be named to a first element without departing from the scope of right of the invention. The term "and/or" includes a combination of a plurality of related items or any one item from among the plurality of related items.

Hereinafter, a dual-mode power amplifier according to an embodiment of the present disclosure will be described with reference to the drawings.

Figure 2:
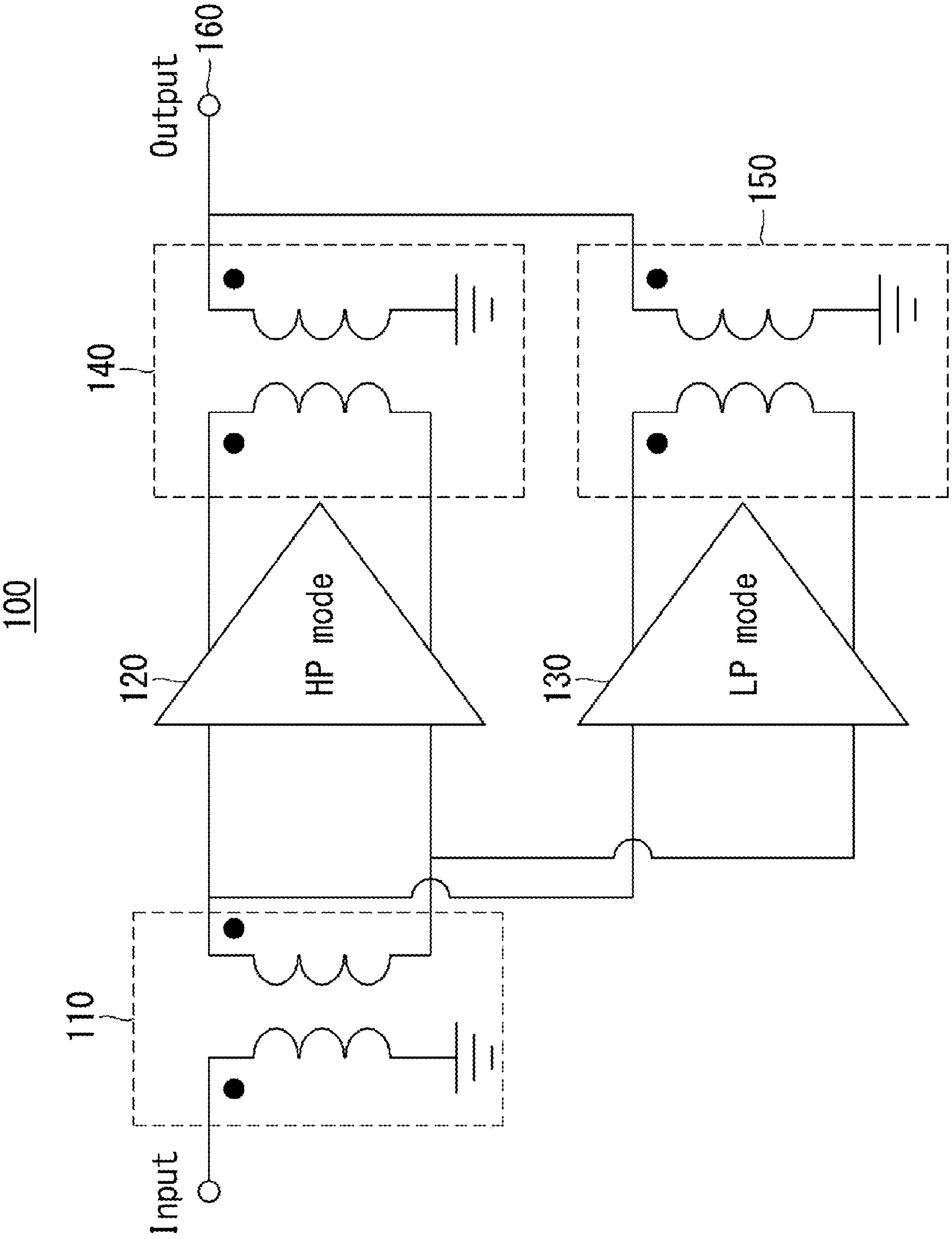
FIG. 2 is a circuit diagram for explaining a dual-mode power amplifier according to an embodiment of the present disclosure.

FIG. 2 is a circuit diagram for explaining a dual-mode power amplifier according to an embodiment of the present disclosure.

A dual-mode power amplifier 100 includes an input transformer 110, a high-power amplifier 120, a low-power amplifier 130, a first transformer 140, a second transformer 150, and an amplifier output stage 160.

The input transformer 110 may include a primary coil and a secondary coil.

The input transformer 110 may have a primary coil connected in series to an input stage to which a signal is input.

The secondary coil of the input transformer 110 may be connected to the input terminals of the high-power amplifier 120 and the low-power amplifier 130, respectively.

The input transformer 110 may electrically isolate an input stage from an amplifier stage consisting of the high-power amplifier 120 and the low-power amplifier 130 included in the circuit.

The input terminal of the high-power amplifier 120 may be connected in series to the secondary coil of the input transformer 110.

An output terminal of the high-power amplifier 120 may be connected in series to the primary coil of the first transformer 140.

The high-power amplifier 120 may consume a relatively larger output than the low-power amplifier 130 to amplify the input signal to a larger output.

The high-power amplifier 120 may include one or more transistors. The transistor may include a bi-polar junction transistor (BJT) or a field effect transistor (FET).

Hereinafter, for convenience of description, it is assumed that the type of transistor is BJT.

The high-power amplifier 120 may include a structure in which a plurality of transistors are connected in parallel, and output power may be increased by connecting the transistors in parallel.

The high-power amplifier 120 may include a first bias that controls the operation of the transistor.

Here, the first bias is connected to each transistor included in the high-power amplifier 120, and the transistor may be controlled to operate in an on-state or off-state.

For example, when the first bias is activated, each transistor may be turned on, and when the first bias is deactivated, each transistor may be turned off.

For example, when the transistor is a BJT, the first bias may be connected to a base of the BJT.

The input terminal of the low-power amplifier 130 may be connected in series to the secondary coil of the input transformer 110.

An output terminal of the low-power amplifier 130 may be connected in series to the primary coil of the second transformer 150.

The low-power amplifier 130 may consume relatively less power than the high-power amplifier 120 to amplify the input signal.

The low-power amplifier 130 may include one or more transistors. The transistor may include a bi-polar junction transistor (BJT) or a field effect transistor (FET).

Hereinafter, for convenience of description, it is assumed that the type of transistor is BJT.

The low-power amplifier 130 may include a structure in which fewer transistors are connected in parallel compared to the high-power amplifier 120.

The low-power amplifier 130 may include a second bias that controls the operation of the transistor.

Here, the second bias is connected to each transistor included in the low-power amplifier 130, and the transistor may be controlled to operate in an on-state or off-state.

For example, when the second bias is activated, each transistor may be turned on, and when the second bias is deactivated, each transistor may be turned off.

For example, when the transistor is a BJT, the second bias may be connected to a base of the BJT.

The first transformer 140 may include a primary coil and a secondary coil.

The primary coil of the first transformer 140 may be connected to an output terminal of the high-power amplifier 120, and the secondary coil of the first transformer 140 may be connected to the amplifier output stage 160.

The first transformer 140 and the second transformer 150 may be used to adjust an impedance.

When the dual-mode power amplifier 100 is in a high-power mode, the first transformer 140 may provide impedance matching to the high-power amplifier 120, and the second transformer 150 may provide an impedance with an infinite value to the low-power amplifier 130.

When the dual-mode power amplifier 100 is in a low-power mode, the second transformer 150 may provide impedance matching to the low-power amplifier 130, and the first transformer 140 may provide an impedance with an infinite value to the high-power amplifier 120.

Here, impedance matching denotes matching the impedance value of the transformer to a predetermined impedance value for each of the high-power amplifier 120 and the low-power amplifier 130.

The amplifier output stage 160 may be connected in series to an output terminal of the first transformer 140 and an output terminal of the second transformer 150, respectively.

The amplifier output stage 160 may sum currents output from the first transformer 140 and the second transformer 150 to output the summed power to the outside.

Figure 3:
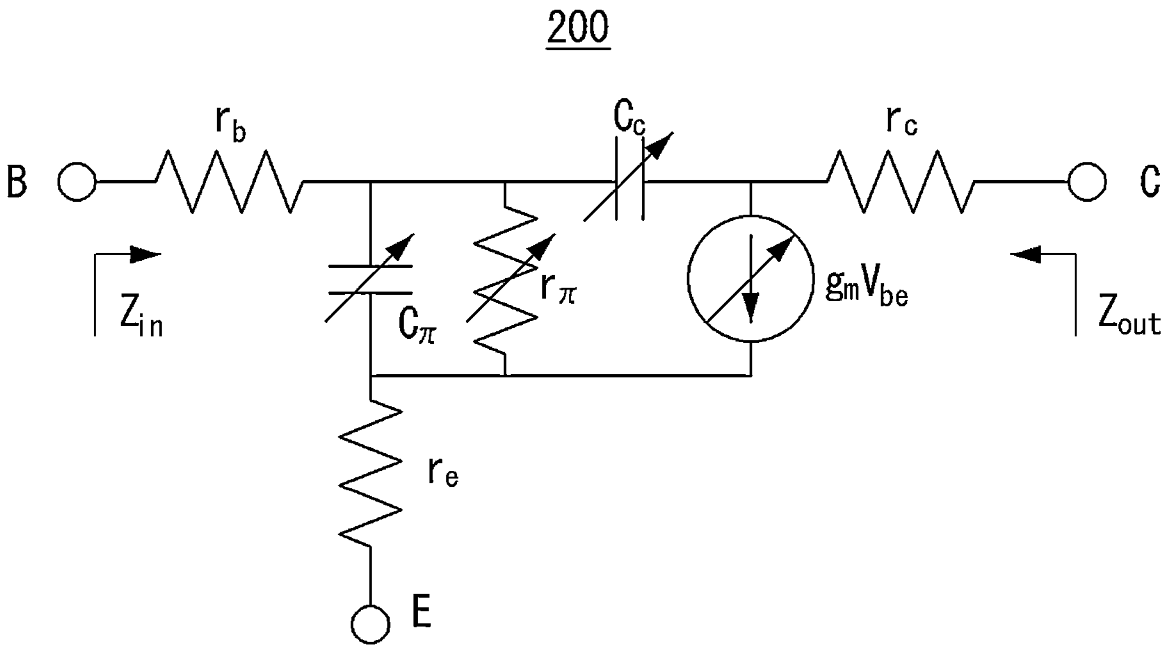
FIG. 3 is an equivalent circuit for explaining a transistor used in a dual-mode power amplifier according to an embodiment of the present disclosure.

FIG. 3 is an equivalent circuit for explaining a transistor used in a dual-mode power amplifier according to an embodiment of the present disclosure.

As shown in FIG. 3, an equivalent circuit 200 of the transistor is an equivalent circuit of a typical bipolar junction transistor (BJT).

An impedance (Zin) seen from the input terminal of the transistor is calculated using Equation 1 below.

An impedance (Zout) seen from the output terminal of the transistor is calculated using Equation 2 below.

$$Z_{in} = r_b + r_e + \frac{Z_\pi}{1 + g_m Z_\pi} \quad \text{[Equation 1]}$$

Here, n is a base extrinsic resistance, $r_e$ is an emitter extrinsic resistance, $Z_\pi$ is a base-emitter diode impedance, and $g_m$ is a transconductance.

$$Z_{out} = r_c + r_e + \frac{1}{j\omega C_c} + \frac{Z_\pi}{1 + g_m Z_\pi}\left[1 - \frac{g_m}{j\omega C_c}\right] \quad \text{[Equation 2]}$$

Here, $r_c$ is a collector extrinsic resistance, and $C_c$ is a base-collector diode capacitance.

An impedance ($Z_{in}$) seen from the input terminal and an impedance ($Z_{out}$) seen from the output terminal are affected by the trans capacitance ($g_m$) and the base-collector diode capacitance ($C_c$), which is a parasitic capacitance, respectively.

Furthermore, $C_\pi$ as shown in FIG. 3 represents the base-emitter diode capacitance.

Figure 4:
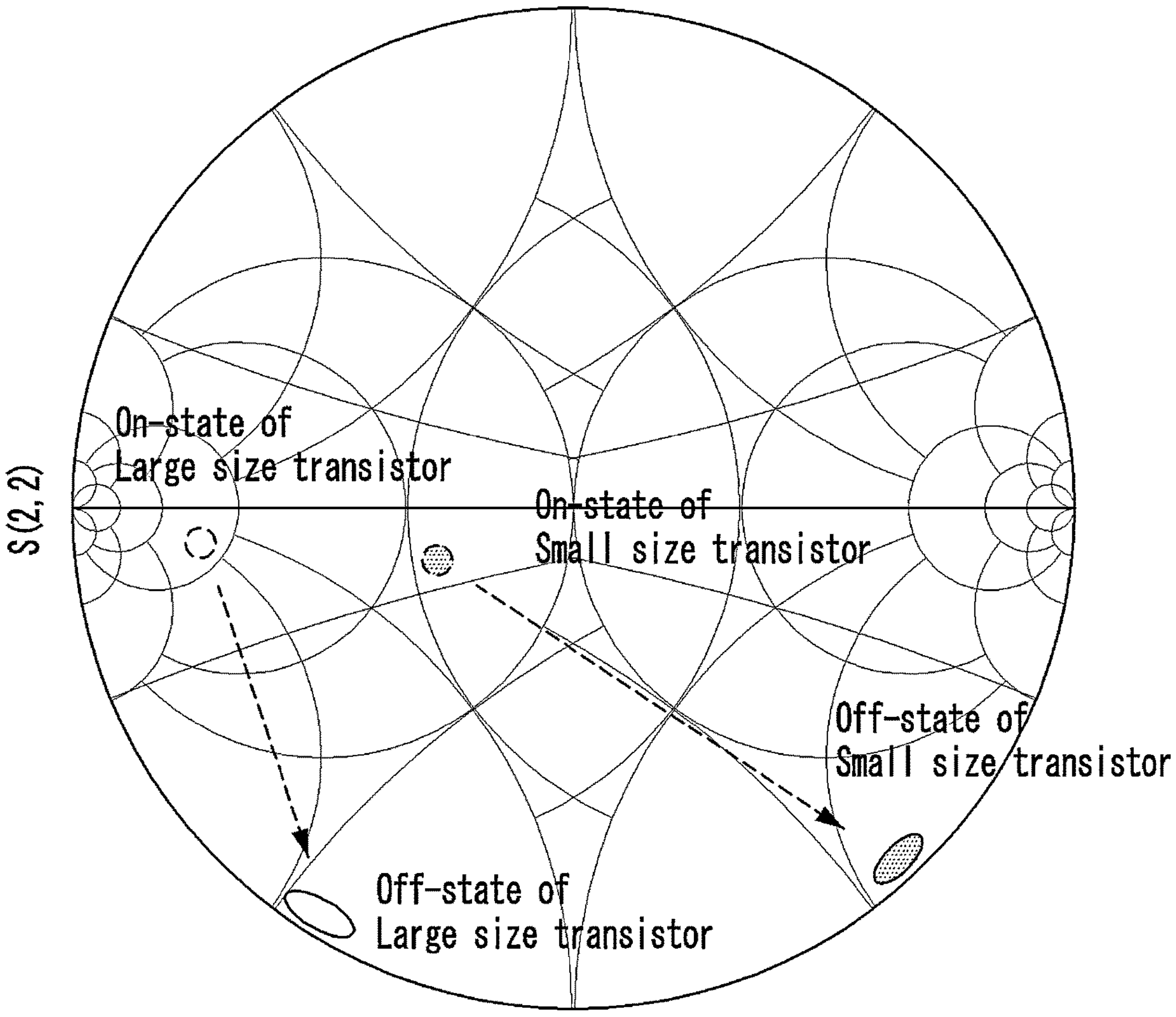
FIG. 4 is a Smith chart for explaining an impedance trace of a transistor included in a dual-mode power amplifier.

FIG. 4 is a Smith chart for explaining an impedance trace of a transistor included in a dual-mode power amplifier.

The Smith chart shows an impedance trace according to the on-state and off-state of the transistor in FIG. 3, wherein the Smith chart shows the $Z_{out}$ of the equivalent circuit 200 in FIG. 3.

A typical transistor is divided into a large size transistor and a small size transistor depending on the size of $g_m$.

When the transistor goes from an on-state to an off-state, the impedance of the transistor moves to the bottom right on the Smith chart due to the influence of a parasitic capacitor $C_c$.

In order for the transistor to operate as if it is open in the off-state, the impedance of the transistor must be moved to a direction close to infinity.

According to an embodiment of the present disclosure, the impedance of the transistor in an off-state may be moved in a direction of infinity using a transformer.

Hereinafter, the impedance adjustment of a dual-mode power amplifier according to an embodiment of the present disclosure will be described with reference to the drawings.

Figure 5:
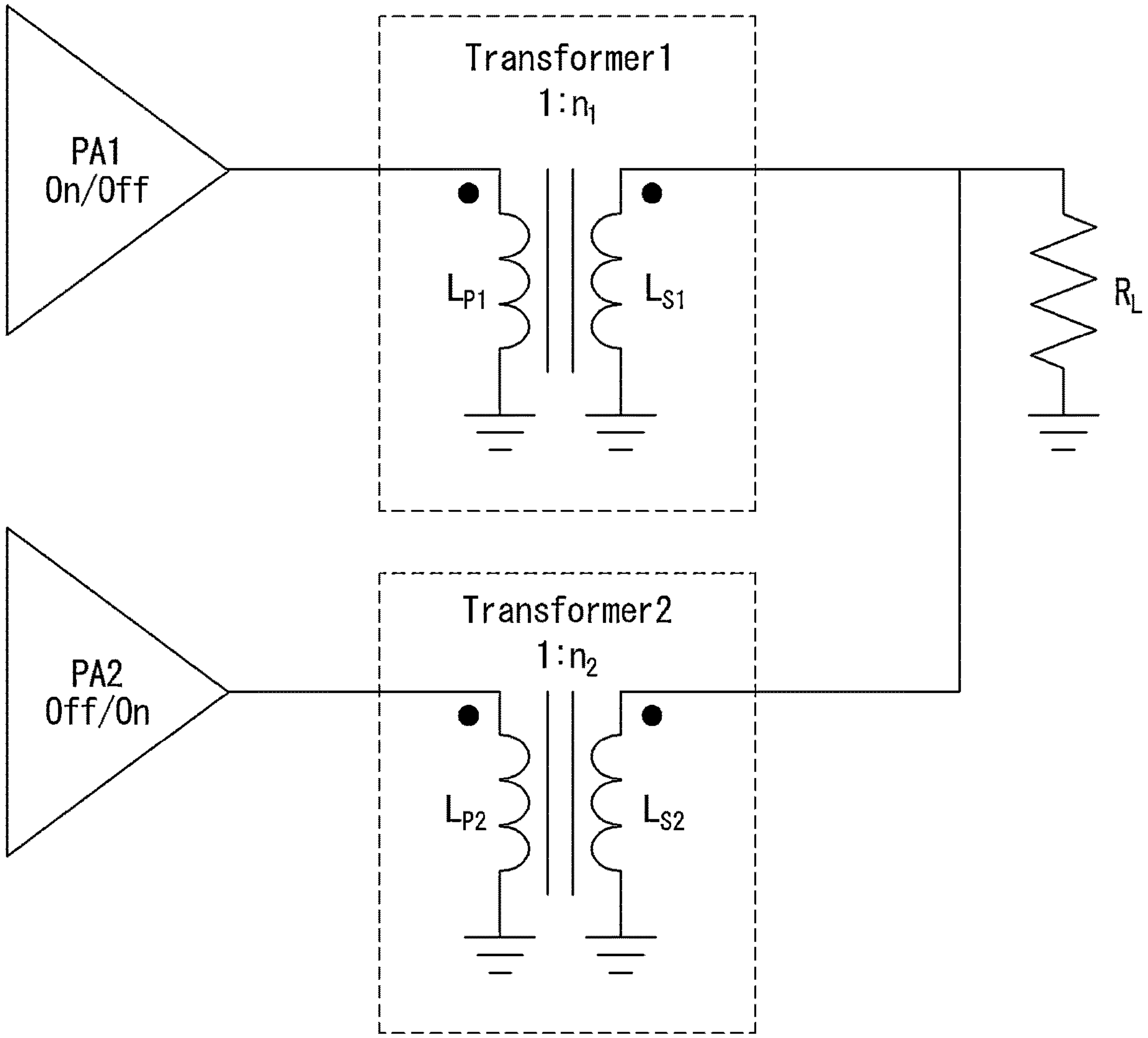
FIG. 5 is a circuit diagram for explaining an operation of a dual-mode power amplifier according to an embodiment of the present disclosure.

FIG. 5 is a circuit diagram for explaining an operation of a dual-mode power amplifier according to an embodiment of the present disclosure.

As shown in FIG. 5, the dual-mode power amplifier 100 may include a high-power amplifier 120, a low-power amplifier 130, a first transformer 140, and a second transformer 150.

Here, an inductance of a primary coil of the first transformer 140 is $L_{p1}$, an inductance of a secondary coil of the first transformer 140 is shown as $L_{s1}$, and an inductance of a primary coil of the second transformer 150 is $L_{p2}$, and an inductance of a secondary coil of the second transformer 150 is shown as $L_{s2}$.

For convenience of description, it is assumed that a winding ratio of the first transformer 140 is 1:$n_1$, and that an inductance ($L_{p1}$) of the primary coil and an inductance ($L_{s1}$) of the secondary coil have a relationship of $n_1^2 * L_{p1} = L_{s1}$.

In addition, it is assumed that a winding ratio of the second transformer 150 is 1:$n_2$, and that an inductance ($L_{p2}$) of the primary coil and an inductance ($L_{s2}$) of the secondary coil have a relationship of $n_2^2 * L_{p2} = L_{s2}$.

Figure 6:
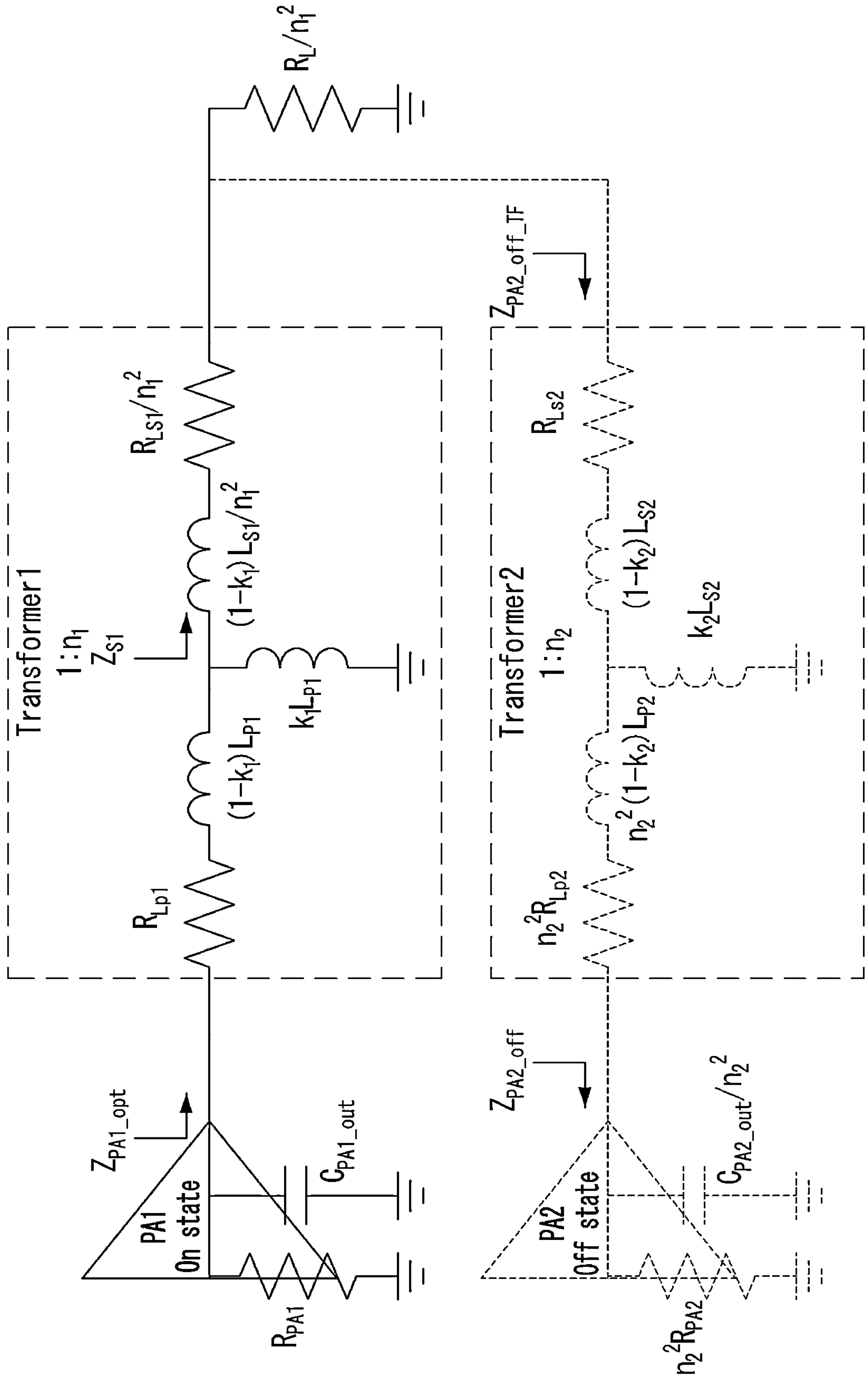
FIG. 6 is an equivalent circuit for explaining an operation in a high-power mode of a dual-mode power amplifier according to an embodiment of the present disclosure.
Figure 7:
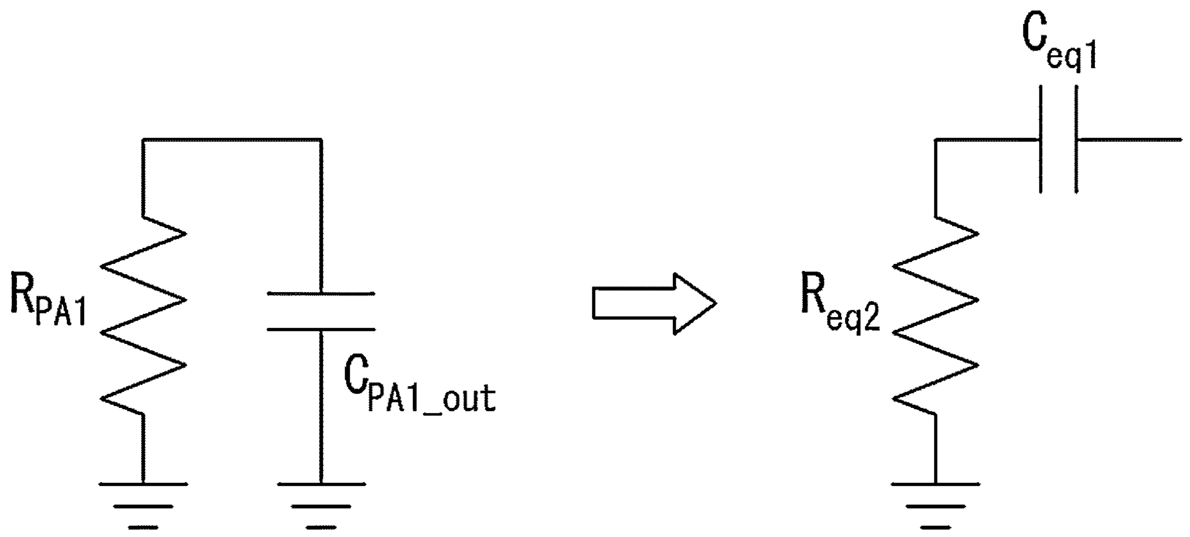
FIG. 7 is an equivalent circuit for explaining a process of merging a resistor and a capacitor connected in parallel to a high-power amplifier.
Figure 8:
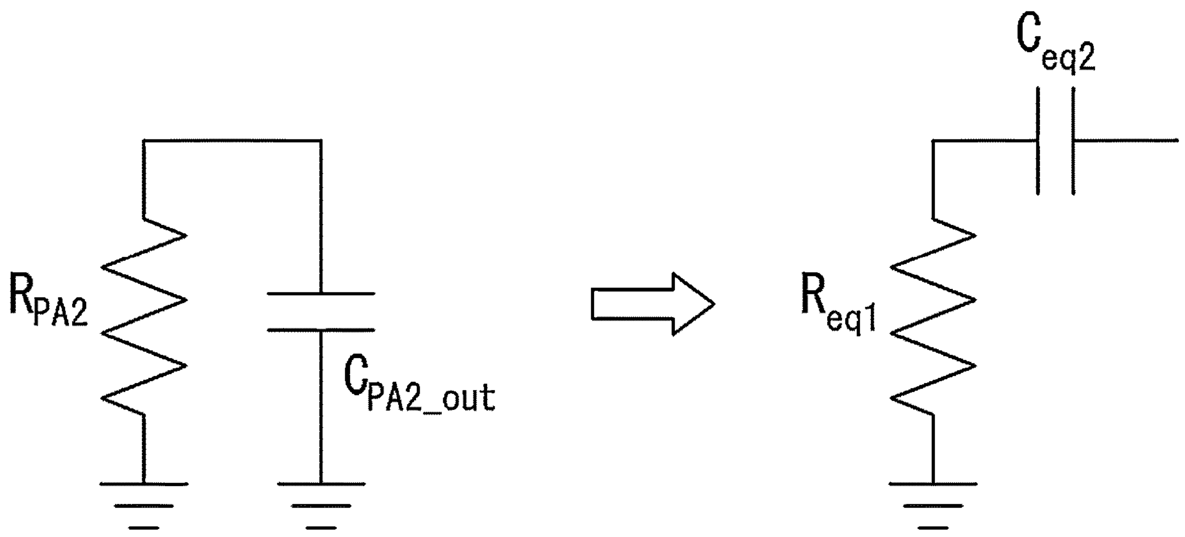
FIG. 8 is an equivalent circuit for explaining a process of merging a resistor and a capacitor connected in parallel to a low-power amplifier.

FIG. 6 is an equivalent circuit for explaining an operation in a high-power mode of a dual-mode power amplifier according to an embodiment of the present disclosure, FIG. 7 is an equivalent circuit for explaining a process of merging a resistor and a capacitor connected in parallel to a high-power amplifier, and FIG. 8 is an equivalent circuit for explaining a process of merging a resistor and a capacitor connected in parallel to a low-power amplifier.

Here, the equivalent circuit is only an example and is not limited thereto.

As shown in FIG. 6, the high-power amplifier 120 may include a parasitic resistance ($R_{PA1}$) and a parasitic capacitance ($C_{PA1\_out}$), and the low-power amplifier 130 may include a parasitic resistance ($R_{PA2}$) and a parasitic capacitance ($C_{PA2\_out}$).

Furthermore, a coupling coefficient of the first transformer 140 is $k_1$, and a coupling coefficient of the second transformer 150 is $k_2$, both of which are shown in the equivalent circuit as shown in FIG. 6.

A first bias connected to a transistor included in the high-power amplifier 120 is activated and a second bias connected to a transistor included in the low-power amplifier 130 is deactivated, so that the dual-mode power amplifier 100 can operate in a high-power mode.

Referring to FIG. 8, when the dual-mode power amplifier 100 operates in a high-power mode, an impedance ($Z_{PA1\_opt}$) seen from the high-power amplifier 120 to the amplifier output stage 160 and an impedance ($Z_{PA2\_off\_TF}$) seen from the amplifier output stage 160 to the low-power amplifier 130 will be described.

Furthermore, as shown in FIGS. 7 and 8, a parasitic resistance ($R_{PA1}$) and a parasitic capacitance ($C_{PA1\_out}$) of the high-power amplifier 120 may be replaced with a series equivalent resistance ($R_{eq1}$) and a series equivalent capacitor ($C_{eq1}$), and a parasitic resistance ($R_{PA2}$) and a parasitic capacitance ($C_{PA2\_out}$) of the low-power amplifier 130 may be replaced with a series equivalent resistance ($R_{eq2}$) and a series equivalent capacitor ($C_{eq2}$).

To summarize, an impedance ($Z_{PA1\_opt}$) seen from the high-power amplifier 120 to the amplifier output stage 160 may be shown as Equation 3 below.

$$Z_{PA1\_out} = R_{Lp1} + j\omega(1-K_1)L_{p1} - \frac{1}{n_1^2}\left(\frac{Z_{S1}}{1+\frac{Z_{S1}}{j\omega k_1 n_1^2 L_{p1}}}\right), \quad \text{[Equation 3]}$$

$$Z_{S1} = R_{S1} + j\omega(1-k_1)L_{S1} + R_L$$

Here, an impedance ($Z_{PA1\_opt}$) seen from the high-power amplifier 120 to the amplifier output stage 160 may be determined by an inductance ($L_{p1}$) of the primary coil of the first transformer 140 and a turns ratio ($n_1$) of the first transformer 140 in Equation 3.

Furthermore, an impedance ($Z_{PA2\_off\_TF}$) seen from the amplifier output stage 160 to the low-power amplifier 130 may be shown as Equation 4 below.

$$Z_{PA2\_off\_TF} = R_{Ls2} + J\omega L_{S2}(1-K_1) + \left[K_2 \cdot j\omega L_{S2} \,||\, n_2^2(R_{eq2}+R_{Lp2}) + \frac{n_2^2}{j\omega C_{eq2}} + j\omega L_{p2}\cdot n_2^2(1-k_2)\right] \quad \text{[Equation 4]}$$

$$R_{eq2} = \frac{R_{PA2}}{1+(\omega P_{PA2}C_{PA2\_out})^2},\; C_{eq2} = \frac{1+(\omega P_{PA2}C_{PA2\_out})^2}{\omega^2 R_{PA2}^2 C_{PA2\_out}}$$

An impedance ($Z_{PA2\_off\_TF}$) seen from the amplifier output stage 160 to the low-power amplifier 130 may be determined by an inductance ($L_{s2}$), a parasitic resistance ($R_{PA2}$), and a parasitic capacitance ($C_{PA2\_out}$) of the secondary coil of the second transformer 150 in Equation 4.

When the dual-mode power amplifier 100 operates in high-power mode, an inductance of the secondary coil of the second transformer 150 may be determined in a direction of increasing a magnitude of the impedance seen from the amplifier output stage 160 to the low-power amplifier 130.

More specifically, using a relationship of $n_2^2 * L_{p2} = L_{s2}$ predefined in FIG. 5, an impedance ($Z_{PA2\_of\_TF}$) seen from the amplifier output stage 160 to the low-power amplifier 130 may leave a very large real component and may have a small imaginary component.

That is, to summarize Equation 4, an impedance ($Z_{PA2\_of\_TF}$) seen from the amplifier output stage 160 to the low-power amplifier 130 may be shown as Equation 5 below.

Here, an inductance ($L_{p2}$) of the primary coil of the second transformer 150 may be determined by a series equivalent capacitor ($C_{eq2}$) by which the parasitic capacitance of the low-power amplifier 130 is replaced.

$$\omega L_{p2} = \frac{1}{\omega C_{eq2}},\; L_{p2} = \frac{1}{\omega^2 C_{eq2}} \quad \text{[Equation 5]}$$

$$Z_{PA2\_off\_TF} = R_{LS2} + \frac{(\omega\,\eta_2 k_2 L_{p2})^2}{R_{eq2}+R_{Lp2}} + j\omega L_{S2}$$

An impedance ($Z_{PA2\_off\_TF}$) seen from the amplifier output stage 160 to the low-power amplifier 130 has a large real value according to Equation 5, and an imaginary component thereof becomes small enough to be ignored.

Therefore, in a high-power mode, for a maximum output of the high-power amplifier 120, an impedance ($Z_{PA1\_opt}$) seen from the high-power amplifier 120 to the amplifier output stage 160 must be adjusted to match the impedance with a load, and an impedance ($Z_{PA2\_off\_TF}$) seen from the amplifier output stage 160 to the low-power amplifier 130 must be adjusted to an impedance close to infinity.

Here, the high-power amplifier 120 and the low-power amplifier 130 may adjust values of an inductance ($L_{p1}$) of the primary coil of the first transformer 140, a turns ratio ($1:n_1$) of the first transformer 140, and an inductance ($L_{p2}$) of the primary coil of the second transformer 150.

That is, when operating in a high-power mode, the high-power amplifier 120 may use a turns ratio ($1:n_1$) of the first transformer 140 and an inductance ($L_{p1}$) of the primary coil of the first transformer 140 to match an optimal impedance that can produce a desired output, and in order for the high-power amplifier 120 to operate independently, the low-power amplifier 130 may adjust an inductance ($L_{p2}$) value of the primary coil of the second transformer 150 to minimize an imaginary component of the impedance.

Figure 9:
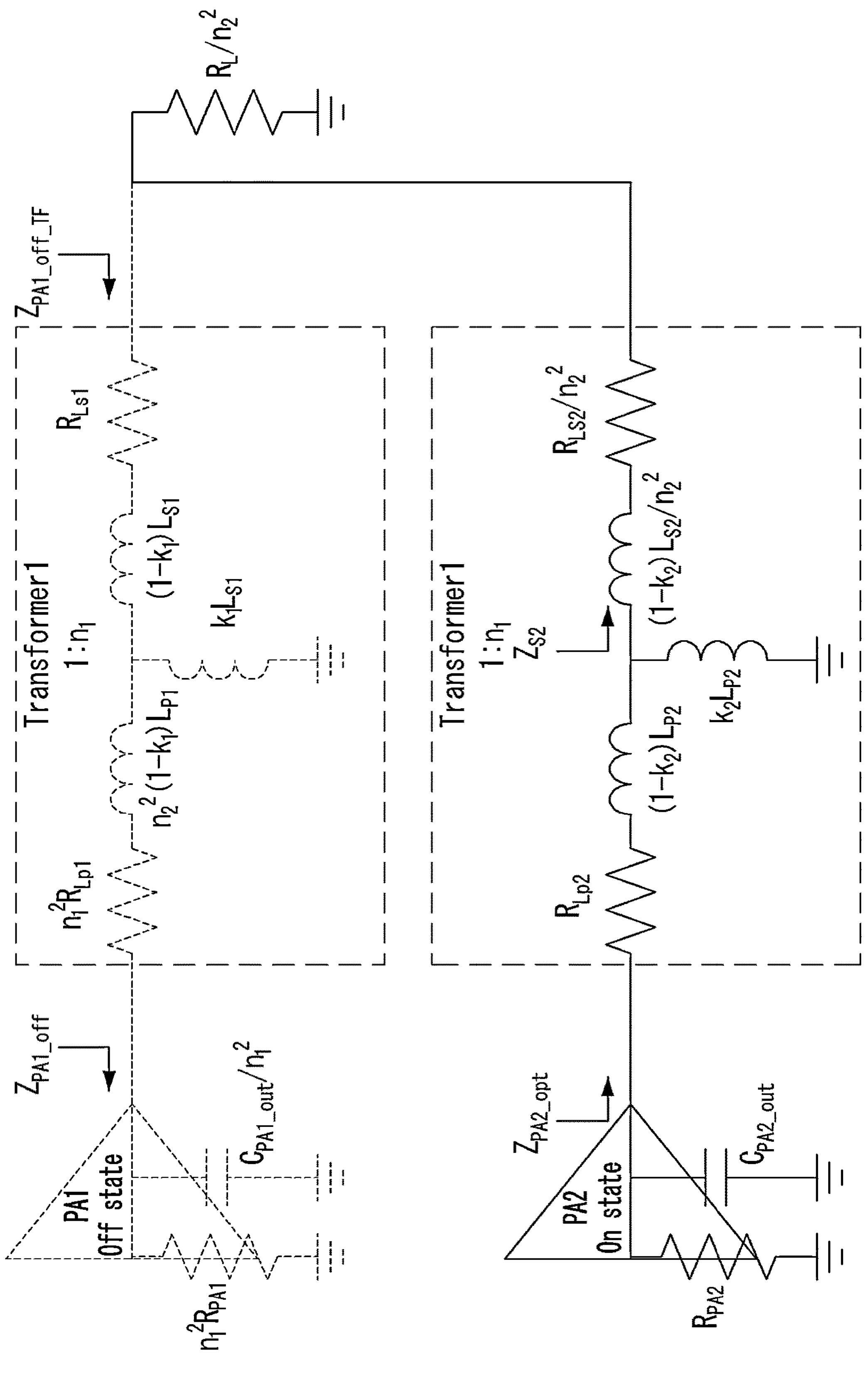
FIG. 9 is an equivalent circuit for explaining an operation in a low-power mode of a dual-mode power amplifier according to an embodiment of the present disclosure.

FIG. 9 is an equivalent circuit for explaining an operation in a low-power mode of a dual-mode power amplifier according to an embodiment of the present disclosure.

Here, the equivalent circuit is only an example and is not limited thereto.

A second bias connected to a transistor included in the low-power amplifier 130 is activated and a first bias connected to a transistor included in the high-power amplifier 120 is deactivated, so that the dual-mode power amplifier 100 can operate in a low-power mode.

When the dual-mode power amplifier 100 operates in a low-power mode, an impedance ($Z_{PA2\_opt}$) seen from the low-power amplifier 130 to the amplifier output stage 160 and an impedance ($Z_{PA1\_of\_TF}$) seen from the amplifier output stage 160 to the high-power amplifier 120 may be derived in the same manner as derived in the high-power mode described in FIG. 6.

In the same manner as shown in FIGS. 7 and 8, a parasitic resistance ($R_{PA1}$) and a parasitic capacitance ($C_{PA1\_out}$) of the high-power amplifier 120 may be replaced with a series equivalent resistance ($R_{eq1}$) and a series equivalent capacitor ($C_{eq1}$), and a parasitic resistance ($R_{PA2}$) and a parasitic capacitance ($C_{PA2\_out}$) of the low-power amplifier 130 may be replaced with a series equivalent resistance ($R_{eq2}$) and a series equivalent capacitor ($C_{eq2}$).

As shown in FIG. 9, an impedance ($Z_{PA2\_opt}$) seen from the low-power amplifier 130 to the amplifier output stage 160 may be shown as Equation 6 below.

$$Z_{PA2\_op} = R_{Lp1} + j\omega(1-K_2)L_{p2} + \frac{1}{n_2^2}\left(\frac{Z_{S2}}{1+\frac{Z_{S2}}{j\omega k_2 n_2^2 L_{P2}}}\right), \quad \text{[Equation 6]}$$

$$Z_{S2} = R_{Lp2} + j\omega(1-k_2)L_{S2} + R_L$$

Here, an impedance ($Z_{PA2\_opt}$) seen from the low-power amplifier 130 to the amplifier output stage 160 may be determined by an inductance ($L_{p2}$) of the primary coil of the second transformer 150 and a turns ratio ($n_2$) of the second transformer 150.

Furthermore, an impedance ($Z_{PA1\_off\_TF}$) seen from the amplifier output stage 160 to the high-power amplifier 120 may be shown as Equation 7 below.

$$Z_{PA1\_off\_TF} = R_{LS1} + j\omega L_{S1}(1-K_1) + \left[K_1 \cdot j\omega L_{S1} \parallel n_1^2(R_{eq1}+R_{Lp1}) + \frac{n_1^2}{j\omega C_{eq1}} + j\omega L_{p1} \cdot n_1^2(1-k_1)\right] \quad \text{[Equation 7]}$$

$$R_{eq1} = \frac{R_{PA1}}{1+(\omega R_{PA1} C_{PA1\_out})^2}, \quad C_{eq1} = \frac{1+(\omega R_{PA1} C_{PA1\_out})^2}{\omega^2 R_{PA1}^2 C_{PA1\_out}}$$

An impedance ($Z_{PA1\_off\_TF}$) seen from the amplifier output stage 160 to the high-power amplifier 120 may be determined by an inductance ($L_{s1}$) of the secondary coil of the first transformer 140, a parasitic resistance ($R_{PA1}$) of the high-power amplifier 120, and a parasitic capacitance ($C_{PA1\_out}$) of the high-power amplifier 120.

When the dual-mode power amplifier 100 operates in a low-power mode, an inductance of the secondary coil of the first transformer 140 may be determined in a direction of increasing a magnitude of the impedance seen from an output stage of the first transformer 140 to the high-power amplifier 120.

More specifically, using a relationship of $n_1^2 * L_{p1} = L_{s1}$ predefined in FIG. 5, an impedance ($Z_{PA1\_of\_TF}$) seen from the amplifier output stage 160 to the high-power amplifier 120 may leave a very large real component of impedance, and may have a small imaginary component thereof.

That is, to summarize Equation 7, an impedance ($Z_{PA1\_of\_TF}$) seen from the amplifier output stage 160 to the high-power amplifier 120 may be shown as Equation 8 below.

Here, an inductance ($L_{p1}$) of the primary coil of the first transformer 140 may be determined by a series equivalent capacitor ($C_{eq2}$) by which the parasitic capacitance of the high-power amplifier 120 is replaced.

$$\omega L_{p1} = \frac{1}{\omega C_{eq1}}, \quad L_{p1} = \frac{1}{\omega^2 C_{eq1}} \quad \text{[Equation 8]}$$

$$Z_{PA1\_off\_TF} = R_{LS1} + \frac{(\omega \eta_1 k_1 L_{p1})^2}{R_{eq1} + R_{Lp1}} + j\omega L_{S1}$$

An impedance ($Z_{PA1\_of\_TF}$) seen from the amplifier output stage 160 to the high-power amplifier 120 has a large real value, and an imaginary component thereof becomes small enough to be ignored.

Therefore, in a low-power mode, for a maximum output of the low-power amplifier 130, an impedance ($Z_{PA2\_opt}$) seen from the low-power amplifier 130 to the amplifier output stage 160 must be adjusted to match the impedance with a load, and an impedance ($Z_{PA1\_off\_TF}$) seen from the amplifier output stage 160 to the high-power amplifier 120 must be adjusted to an impedance close to infinity.

Here, the high-power amplifier 120 and the low-power amplifier 130 may adjust values of an inductance ($L_{p2}$) of the primary coil of the second transformer 150, a turns ratio ($1:n_2$) of the second transformer 150, and an inductance ($L_{p1}$) of the primary coil of the first transformer 140.

That is, when operating in a low-power mode, in order for the low-power amplifier 130 to operate independently, the high-power amplifier 120 may adjust an inductance ($L_{p1}$) value of the primary coil of the first transformer 140 to minimize an imaginary component of the impedance, and the low-power amplifier 130 may use a turns ratio ($1:n_2$) of the second transformer 150 and an inductance ($L_{p2}$) of the primary coil of the second transformer 150 to match an optimal impedance that can produce a desired output.

Figure 10:
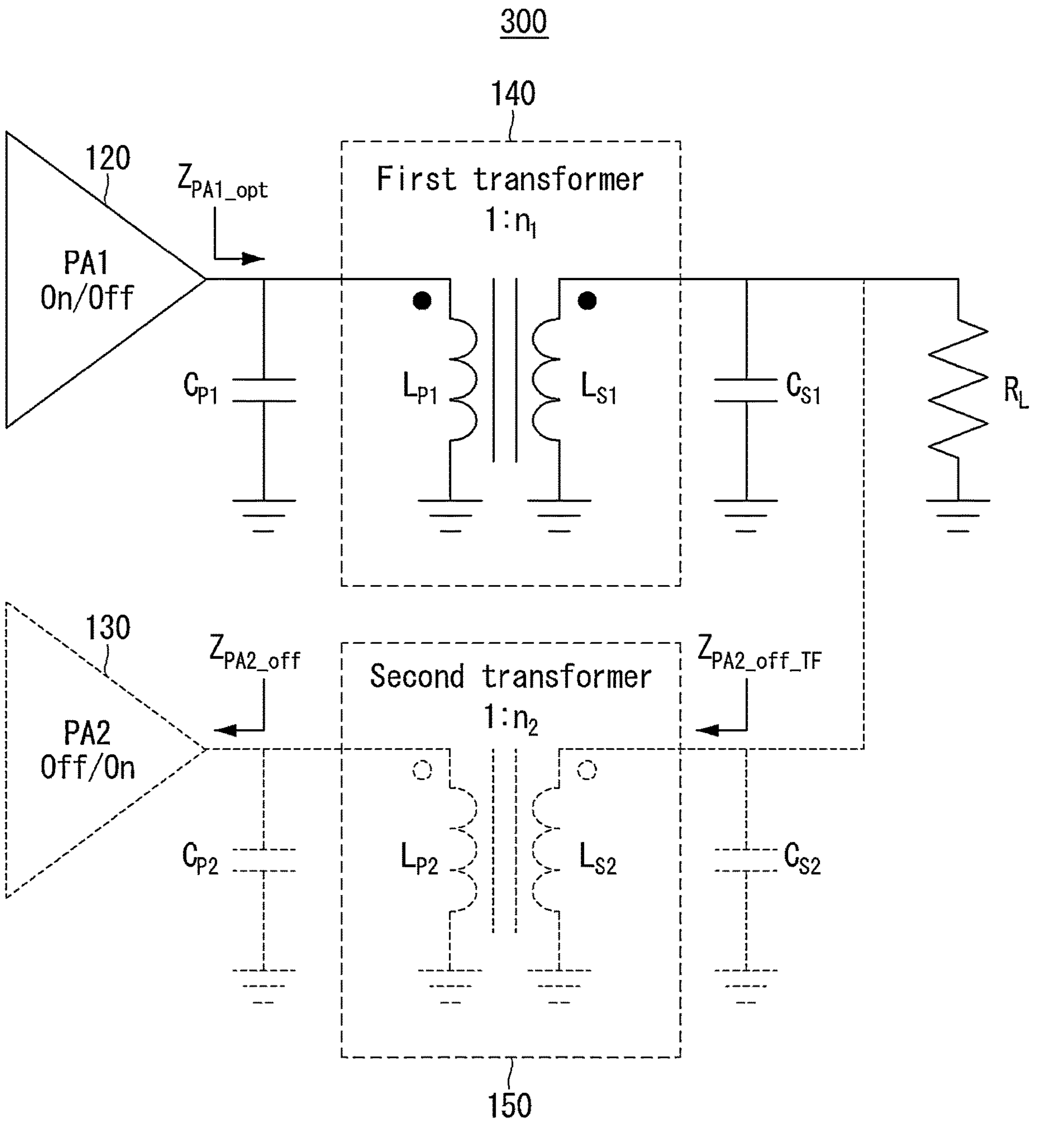
FIG. 10 is a circuit diagram for explaining an operation of a high-power mode in a dual-mode power amplifier according to another embodiment of the present disclosure.
Figure 11:
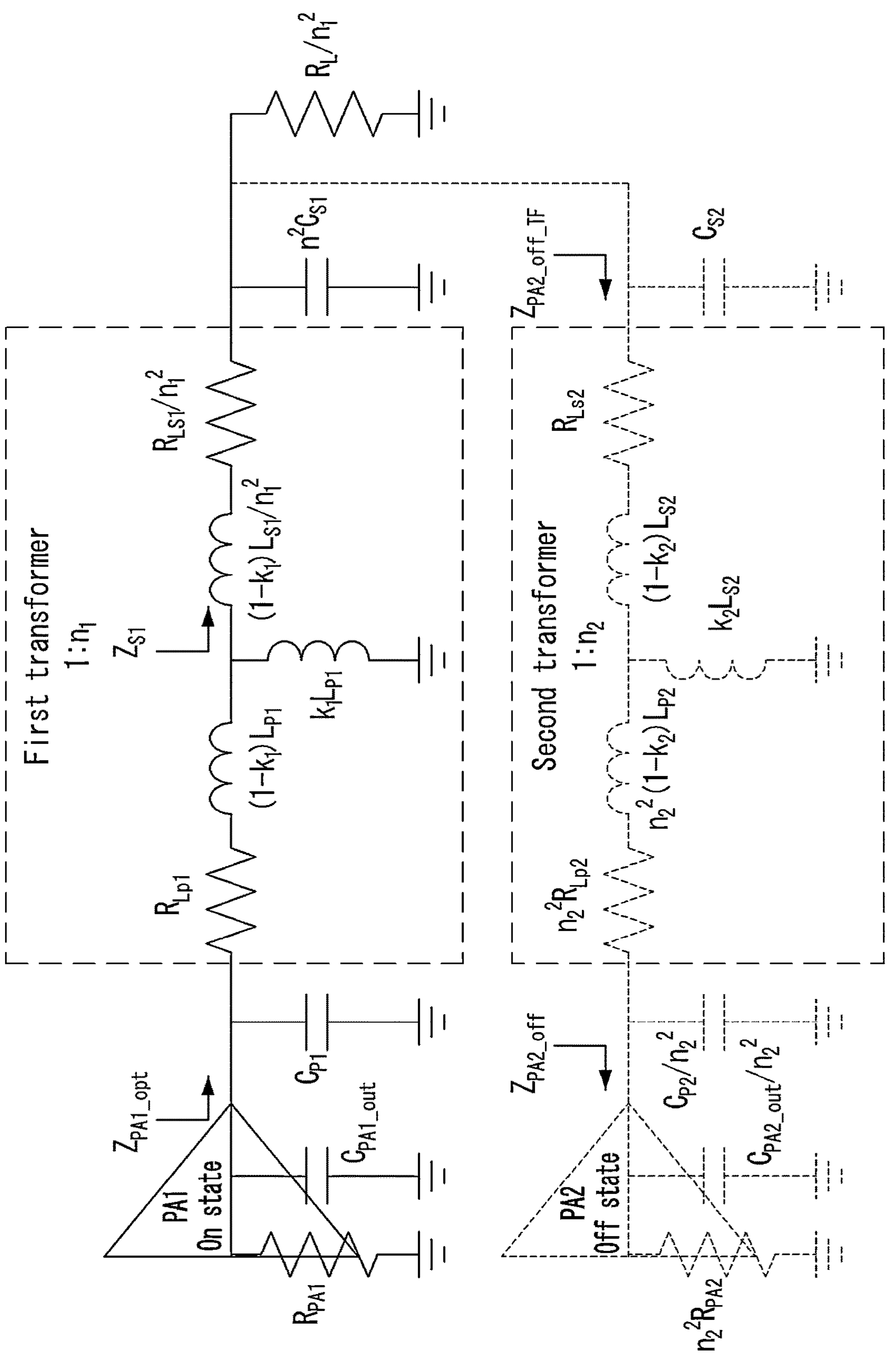
FIG. 11 is an equivalent circuit of the circuit diagram of FIG. 10.

FIG. 10 is a circuit diagram for explaining an operation of a high-power mode in a dual-mode power amplifier according to another embodiment of the present disclosure, and FIG. 11 is an equivalent circuit of the circuit diagram of FIG. 10.

With reference to FIGS. 10 and 11, impedance adjustment using a transformer will be described.

The dual-mode power amplifier 100 may further include a first front-end capacitor ($C_{p1}$) connected in parallel to a front end of the first transformer 140, a first rear-end capacitor ($C_{s1}$) connected in parallel to a rear end of the first transformer 140, a second front-end capacitor ($C_{p2}$) connected in parallel to a front end of the second transformer 150 and a second rear-end capacitor ($C_{s2}$) connected in parallel to a rear end of the second transformer 150.

For convenience of description, it is assumed that a turns ratio of the first transformer 140 is $1:n_1$, an inductance of the primary coil is $L_{p1}$, an inductance of the secondary coil is $L_{s1}$.

For convenience of description, it is assumed that a turns ratio of the second transformer 150 is $1:n_2$, an inductance of the primary coil is $L_{p2}$, and an inductance of the secondary coil is $L_{s2}$.

FIG. 11 is an equivalent circuit 400 related to the circuit diagram 300 of FIG. 10. The equivalent circuit 400 is only an example and is not limited thereto.

Here, FIGS. 10 and 11 have already been described with reference to FIGS. 5 and 6, and thus the detailed description thereof will be omitted.

Meanwhile, the quality factors of the primary and secondary coils of the first transformer 140 are defined as $Q_{p1}$ and $Q_{s1}$, respectively.

The quality factors of the primary and secondary coils of the second transformer 150 are defined as $Q_{p2}$ and $Q_{s2}$, respectively.

A relationship among a quality factor, a turns ratio, and a coupling coefficient is calculated using Equation 9 below.

$$\eta_n = \frac{1}{1 + \sqrt{\left(1 + \frac{1}{Q_{pn}Q_{sn}k_n^2}\right) * \frac{1}{Q_{pn}Q_{sn}k_n^2} + \frac{2}{Q_{pn}Q_{sn}k_n^2}}} \quad \text{[Equation 9]}$$

Under the above definition, an impedance ($Z_{PA1\_opt}$) seen from the high-power amplifier 120 to the amplifier output stage 160 and an impedance ($Z_{PA2\_of\_TF}$) seen from the amplifier output stage 160 to the low-power amplifier 130 are expressed as Equation 10 and Equation 11 below.

$$Z_{PA1\_opt} = A_{PA1\_opt} * \left(\frac{n_1^2}{R_L} + \frac{1}{j\omega L_{p1}} + j\omega C_{p1}\right)^{-1} = A_{PA1\_opt} * \left(\frac{R_L}{n_1^2} \| j\omega L_{p1} \| \frac{1}{j\omega C_{p1}}\right) \quad \text{[Equation 10]}$$

$$A_{PA1\_opt} \equiv \left(1 + \frac{1}{\frac{1}{Q_{S1}^2} + \frac{Q_{p1}}{Q_{S1}}k_1^2}\right) * \frac{\frac{Q_{p1}}{k_1^2} + Q_{S1}}{Q_{p1}}$$

$$Z_{PA2\_off\_TF} = A_{PA2\_off} * \left(\frac{1}{n_2^2 * Z_{PA2\_off}} + \frac{1}{j\omega L_{S2}} + j\omega C_{S2}\right)^{-1} = A_{PA2\_off} * \left(n_2^2 * Z_{PA2\_off} \| j\omega L_{S2} \| \frac{1}{j\omega C_{S2}}\right) \quad \text{[Equation 11]}$$

$$A_{PA2\_off} \equiv \left(1 + \frac{1}{\frac{1}{Q_{p2}^2} + \frac{Q_{S2}}{Q_{p2}}k_2^2}\right) * \frac{\frac{Q_{S2}}{k_2^2} + Q_{p2}}{Q_{S2}}$$

Referring to the above formula, a value of the impedance ($Z_{PA1\_opt}$) seen from the high-power amplifier 120 to the amplifier output stage 160 may be determined by an inductance ($L_{p1}$) of the primary coil and a first front-end capacitor ($C_{p1}$), an impedance ($Z_{PA2\_off\_TF}$) seen from the amplifier output stage 160 to the low-power amplifier 130 may be determined by an inductance ($L_{s2}$) of the secondary coil and a second rear-end capacitor ($C_{s2}$).

In a high-power mode, for a maximum output of the high-power amplifier 120, an impedance ($Z_{PA1\_opt}$) seen from the high-power amplifier 120 to the amplifier output stage 160 must be adjusted to match the impedance with a load, and an impedance ($Z_{PA2\_off\_TF}$) seen from the amplifier output stage 160 to the low-power amplifier 130 must be adjusted to an impedance close to infinity.

For this purpose, the dual-mode power amplifier 100 may adjust values of an inductance ($L_{p1}$) of the primary coil of the first transformer 140, a capacitance ($C_{p1}$) of the first front-end capacitor, an inductance ($L_{s2}$) of the secondary coil of the second transformer 150, and a capacitance ($C_{s2}$) of the second rear-end capacitor.

A first bias connected to a transistor included in the high-power amplifier 120 is deactivated and a second bias connected to a transistor included in the low-power amplifier 130 is activated, so that the dual-mode power amplifier 100 can operate in a low-power mode.

Referring to FIG. 11, when the dual-mode power amplifier 100 operates in a low-power mode, an impedance ($Z_{PA2\_opt}$) seen from the low-power amplifier 130 to the amplifier output stage 160 and an impedance ($Z_{PA1\_off\_TF}$) seen from the amplifier output stage 160 to the high-power amplifier 120 may be derived in the same manner as derived in the high-power mode.

In order to avoid duplication of description, when using the equivalent circuit 400, which is symmetrically configured, in order for an impedance ($Z_{PA2\_opt}$) seen from the low-power amplifier 130 to the amplifier output stage 160 to be impedance matched and for an impedance ($Z_{PA1\_off\_TF}$) seen from the amplifier output stage 160 to the high-power amplifier 120 to approach infinity, the dual-mode power amplifier 100 may adjust values of an inductance ($L_{p2}$) of the primary coil of the second transformer 150, a capacitance ($C_{p2}$) of the second front-end capacitor, an inductance ($L_{s1}$) of the secondary coil of the first transformer 140, and a capacitance ($C_{s1}$) of the first rear-end capacitor.

Summarizing the results of the above description, the dual-mode power amplifier 100 may obtain a maximum output independently in the low-power and high-power modes by adjusting values of an inductance ($L_{p1}$) of the primary coil of the first transformer 140, an inductance ($L_{s1}$) of the secondary coil of the first transformer 140, a first front-end capacitor ($C_{p1}$), a first rear-end capacitor ($C_{s1}$), an inductance ($L_{p2}$) of the primary coil of the second transformer 150, an inductance ($L_{s2}$) of the secondary coil of the second transformer 150, a second front-end capacitor ($C_{p2}$), and a second rear-end capacitor ($C_{s2}$).

Hereinafter, an impedance trace of the dual-mode power amplifier according to an embodiment of the present disclosure will be described.

Figure 12:
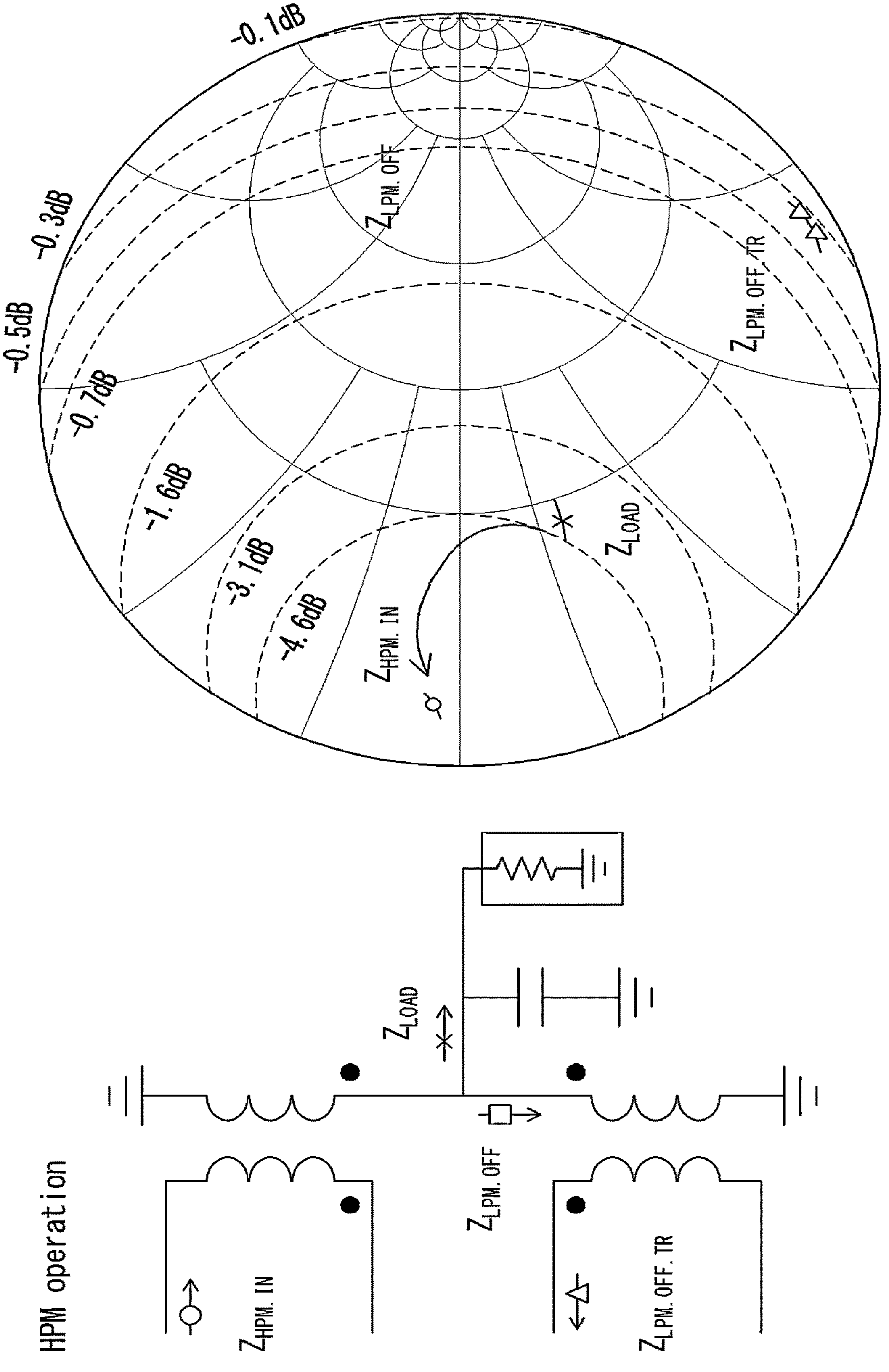
FIG. 12 is a Smith chart showing an impedance trace during an operation in a high-power mode of a dual-mode power amplifier according to an embodiment of the present disclosure.

FIG. 12 is a Smith chart showing an impedance trace during an operation in a high-power mode of a dual-mode power amplifier according to an embodiment of the present disclosure.

When operating in a high-power mode (HPM operation), the high-power amplifier 120 operates and the low-power amplifier 130 does not operate.

Here, an impedance ($Z_{HPM.IN}$) seen from the primary coil of the first transformer 140 to the amplifier output stage 160 is an impedance for an optimal output of the high-power amplifier 120, and an impedance ($Z_{LOAD}$) seen from the secondary coil of the first transformer 140 to the amplifier output stage 160 is typically 50 [ohm].

Here, the first transformer 140 may be used to move an output impedance of the high-power amplifier 120 from $Z_{LOAD}$ to $Z_{HPM.IN}$.

An impedance $Z_{LPM.OFF}$ seen from the amplifier output stage 160 to the secondary coil of the second transformer 150 and an impedance $Z_{LPM.OFF.TR}$ seen from the primary coil of the second transformer 150 to the low-power amplifier 130 moves in a direction of impedance close to infinity on the Smith chart.

In this manner, when operating in a high-power mode, an impedance conversion and loss occurring in impedance matching by the first transformer 140 and the second transformer 150 may be minimized.

Figure 13:
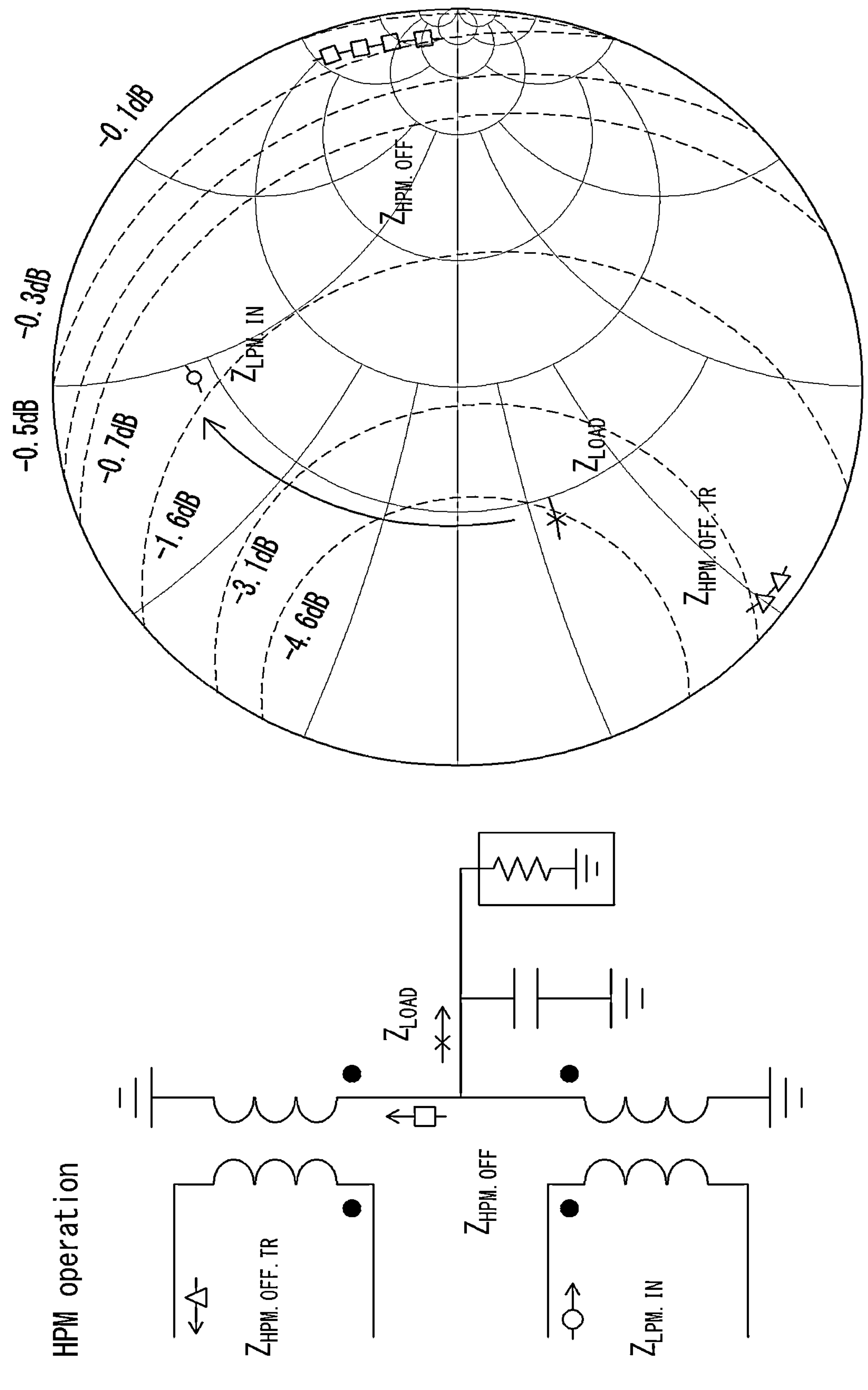
FIG. 13 is a Smith chart showing an impedance trace during an operation in a low-power mode of a dual-mode power amplifier according to an embodiment of the present disclosure.

FIG. 13 is a Smith chart showing an impedance trace during an operation in a low-power mode of a dual-mode power amplifier according to an embodiment of the present disclosure.

When operating in a low-power mode (LPM operation), the high-power amplifier 130 operates and the high-power amplifier 120 does not operate.

Here, an impedance ($Z_{LPM.IN}$) seen from the primary coil of the second transformer 150 to the amplifier output stage 160 is an impedance for an optimal output of the low-power amplifier 130, and an impedance ($Z_{LOAD}$) seen from the secondary coil of the second transformer 150 to the amplifier output stage 160 is typically 50 [ohm].

Here, the second transformer 150 may be used to move an output impedance of the low-power amplifier 130 from $Z_{LOAD}$ to $Z_{LPM.IN}$.

An impedance $Z_{HPM.OFF}$ seen from the amplifier output stage 160 to the secondary coil of the first transformer 140 and an impedance $Z_{HPM.OFF.TR}$ seen from the primary coil of the first transformer 140 to the high-power amplifier 120 moves in a direction of impedance close to infinity on the Smith chart.

In this manner, when operating in a low-power mode, an impedance conversion and loss occurring in impedance matching by the first transformer 140 and the second transformer 150 may be minimized.

That is, as shown in FIGS. 12 and 13, the dual-mode power amplifier 100 may exhibit a maximum output in both the high-power mode and low-power mode by using a transformer.

Figure 14:
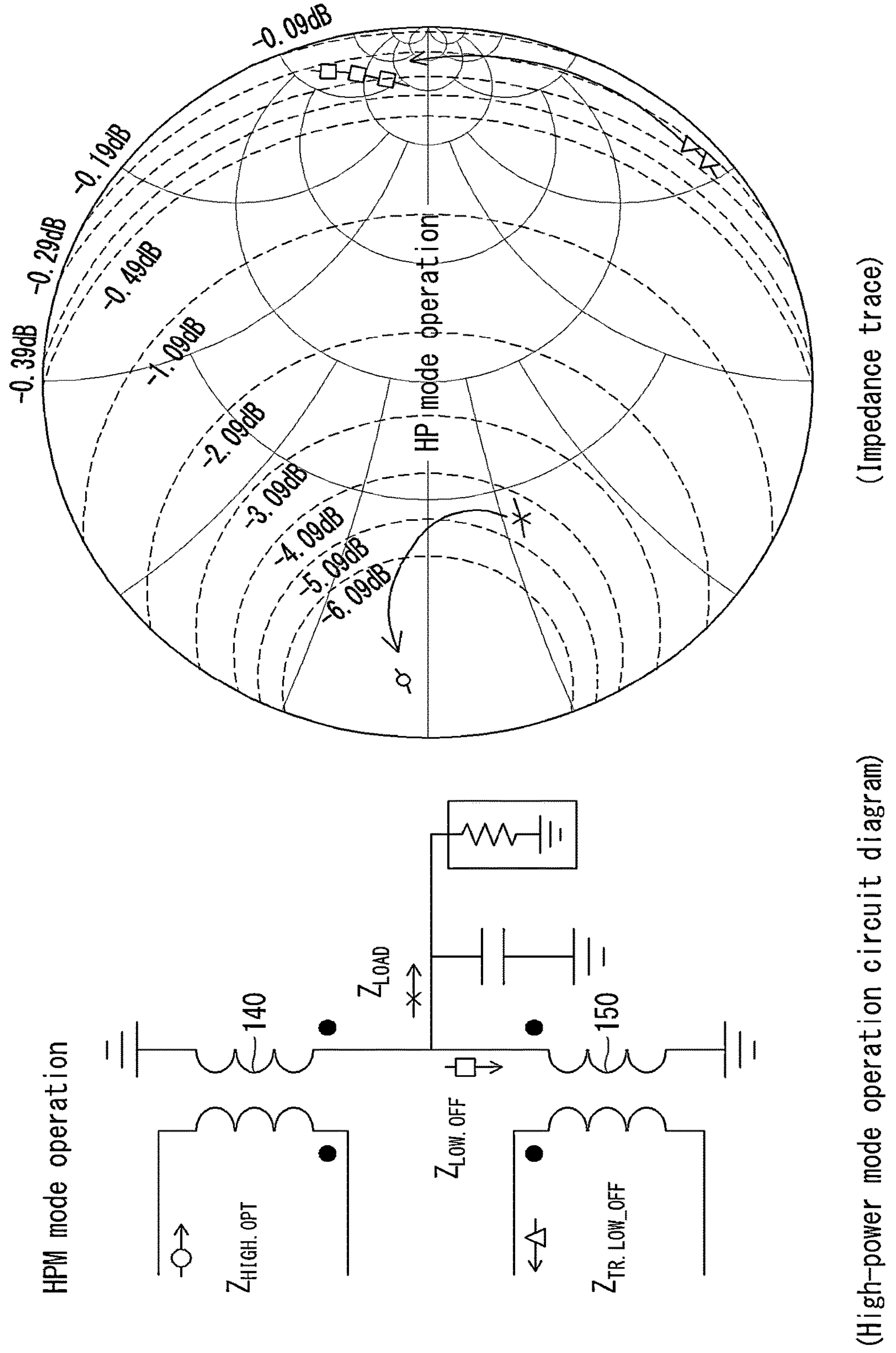
FIG. 14 is a Smith chart showing an impedance trace during an operation in a high-power mode of a dual-mode power amplifier according to another embodiment of the present disclosure.

FIG. 14 is a Smith chart showing an impedance trace during an operation in a high-power mode of a dual-mode power amplifier according to another embodiment of the present disclosure. Referring to FIG. 14, the impedance trace will be described.

The trace of each impedance on the Smith chart will be described with reference to the equivalent circuit 400 shown in FIG. 11 and the above equation.

In the high-power mode, the high-power amplifier 120 operates and the low-power amplifier 130 does not operate.

An impedance $Z_{HIGH\_OPT}$ seen from the primary coil of the first transformer 140 to the amplifier output stage 160 is an impedance for an optimal output of the high-power amplifier 120.

An impedance $Z_{LOAD}$ seen from the secondary coil of the first transformer 140 to the amplifier output stage 160 is typically 50 [ohm].

The first transformer 140 may be used to move an output impedance of the high-power amplifier 120 from $Z_{LOAD}$ to $Z_{HIGH\_OPT}$.

An impedance $Z_{LOW\_OFF}$ seen from the amplifier output stage 160 to the secondary coil of the second transformer 150 and an impedance $Z_{TR.LOW\_OFF}$ seen from the primary coil of the second transformer 150 to the low-power amplifier 130 moves in a direction of impedance close to infinity on the Smith chart.

When operating in a high-output mode, an impedance conversion and loss occurring in impedance matching by the first transformer 140 and the second transformer 150 may be minimized.

Figure 15:
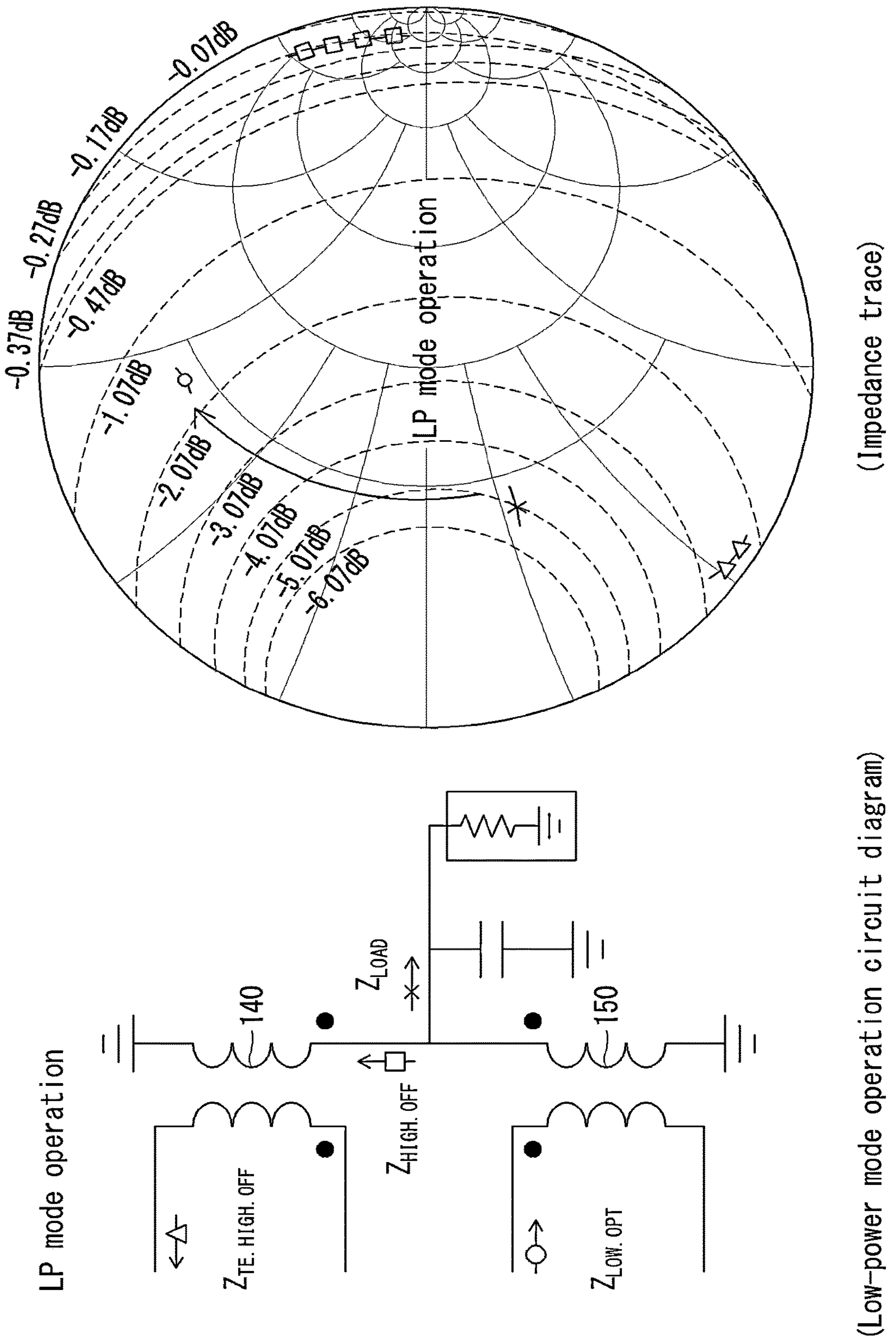
FIG. 15 is a Smith chart showing an impedance trace during an operation in a low-power mode of a dual-mode power amplifier according to another embodiment of the present disclosure.

FIG. 15 is a Smith chart showing an impedance trace during an operation in a low-power mode of a dual-mode power amplifier according to another embodiment of the present disclosure. Referring to FIG. 15, the impedance trace will be described.

The trace of each impedance on the Smith chart will be described with reference to the equivalent circuit shown in FIG. 11 and the above equation.

In a low-power mode, the low-power amplifier 130 operates and the high-power amplifier 120 does not operate.

An impedance $Z_{LOW\_OPT}$ seen from the primary coil of the second transformer 150 to the amplifier output stage 160 is an impedance for an optimal output of the low-power amplifier 130.

An impedance $Z_{LOAD}$ seen from the secondary coil of the second transformer 150 to the amplifier output stage 160 is typically 50 [ohm]. The second transformer 150 may be used to move an output impedance of the low-power amplifier 130 from $Z_{LOAD}$ to $Z_{LOW\_OPT}$.

An impedance $Z_{HIGH\_OFF}$ seen from the amplifier output stage 160 to the secondary coil of the first transformer 140 and an impedance $Z_{TR.HIGH\_OFF}$ seen from the primary coil of the first transformer 140 to the high-power amplifier 120 moves in a direction of impedance close to infinity on the Smith chart.

When operating in a high-output mode, an impedance conversion and loss occurring in impedance matching by the first transformer 140 and the second transformer 150 may be minimized.

Referring to the impedance traces of FIGS. 14 and 15, the dual-mode power amplifier 100 may exhibit a maximum output in both the high-power mode and low-power mode by using a transformer.

Figure 16:
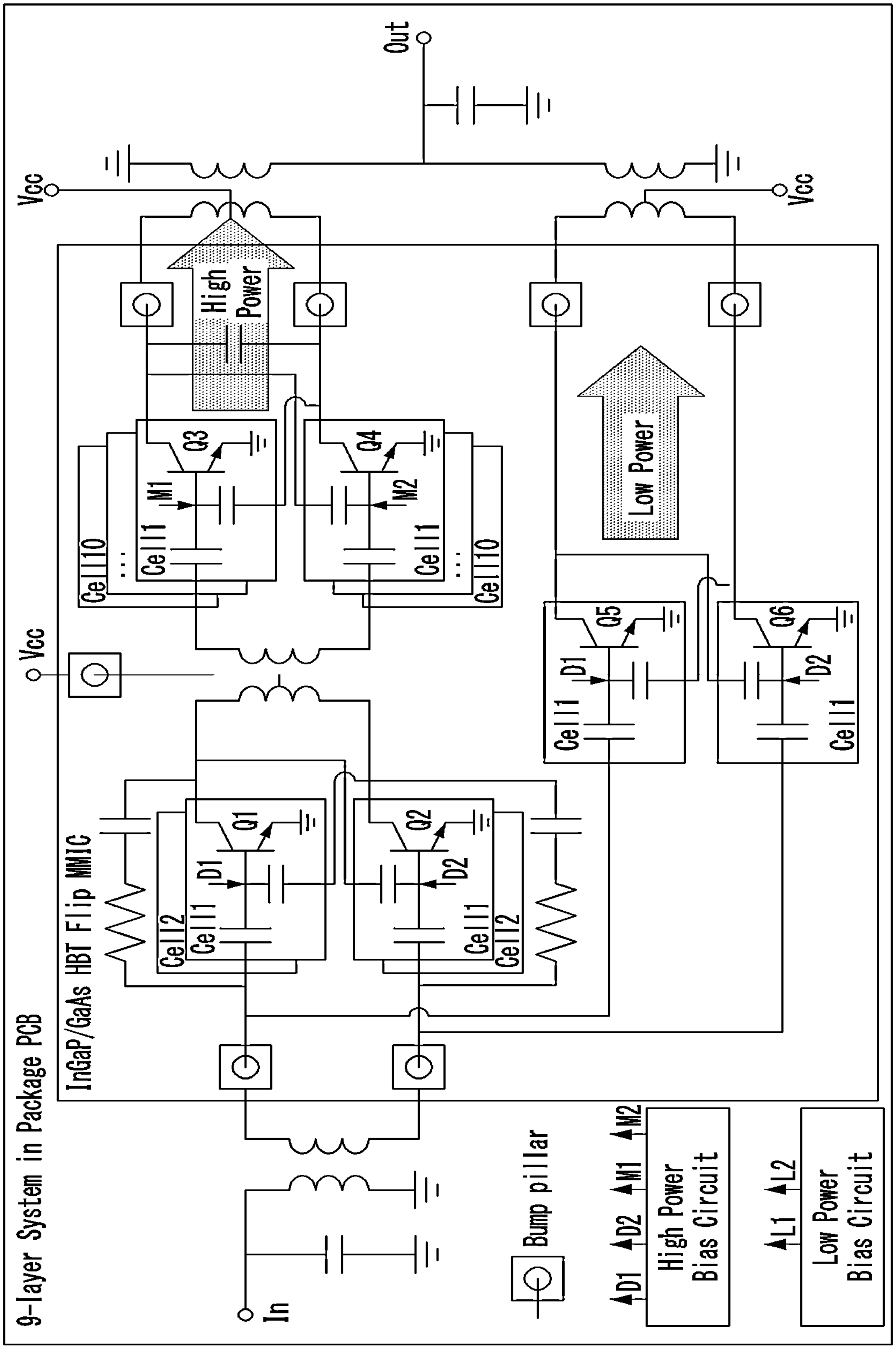
FIG. 16 is a schematic circuit diagram for implementation on a PCB of a dual-mode power amplifier according to an embodiment of the present disclosure.

FIG. 16 is a schematic circuit diagram for implementation on a PCB of a dual-mode power amplifier according to an embodiment of silver present disclosure.

As shown in FIG. 16, the high-power amplifier 120 and the low-power amplifier 130 may be implemented in a single MMIC using an InGaP/GaAs HBT process.

The high-power amplifier 120 may increase an output through one or more transistors connected in parallel and series.

Figure 17:
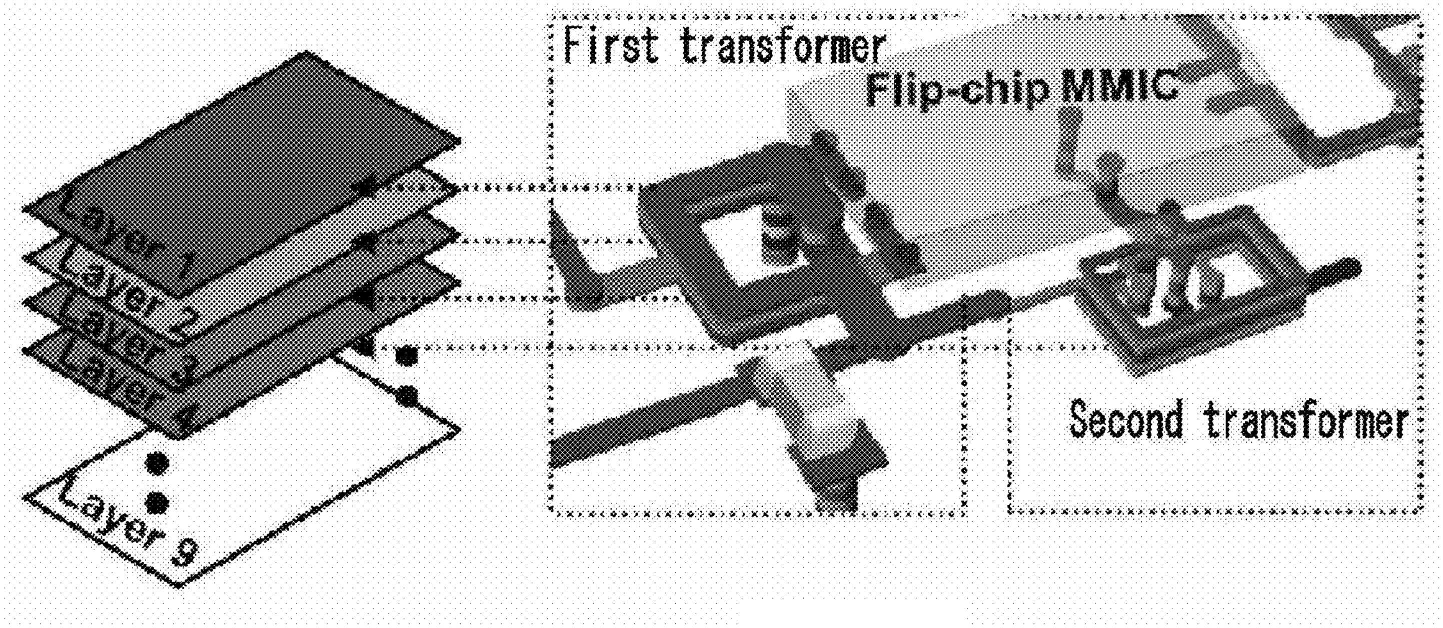
FIG. 17 is an exemplary diagram for explaining element values set for an actual design of a dual-mode power amplifier according to an embodiment of the present disclosure.

FIG. 17 is an exemplary diagram for explaining element values set for an actual design of a dual-mode power amplifier according to an embodiment of the present disclosure.

As shown in FIG. 17, for example, an inductance of the primary coil of the first transformer (HPM TF) 140 may be 0.76 [nH], an inductance of the secondary coil may be 1.9 [nH], a quality factor of the primary coil may be 59, a quality factor of the secondary coil may be 67, a coupling coefficient thereof may be 0.74, and a turns ratio thereof may be 1.6.

For example, an inductance of the primary coil of the second transformer (LPM TF) 150 may be 3.1 [nH], an inductance of the secondary coil may be 2.4 [nH], a quality factor of the primary coil may be 36, a quality factor of the secondary coil may be 40, a coupling coefficient thereof may be 0.67, and a turns ratio thereof may be 0.87.

As shown in FIG. 17, the first transformer 140 and the second transformer 150 may be implemented as a microstrip pattern on one or more printed circuit board (PCB) layers.

For example, the first transformer 140 may be implemented as a single loop-shaped microstrip pattern on 10 PCB layers, and the second transformer 150 may be implemented as a single loop-shaped microstrip pattern on a smaller number of PCB layers.

According to an embodiment of the present disclosure, because the first transformer 140 is composed of a parallel connection of microstrip patterns implemented on more PCB layers than the second transformer 150, each coil of the first transformer 140 may have a smaller inductance than each coil of the second transformer 150.

Figure 18:
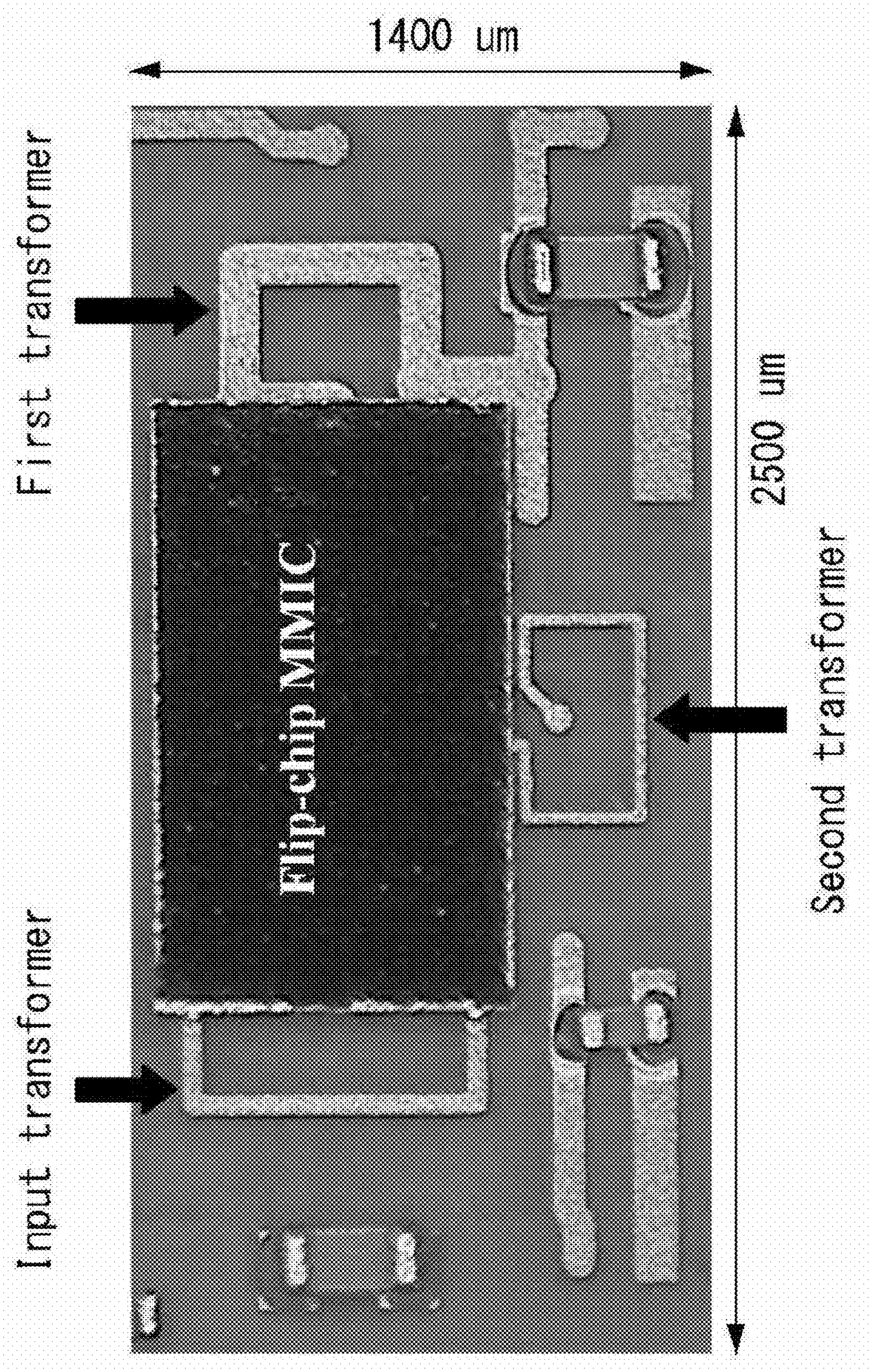
FIG. 18 is a diagram for explaining a PCB on which a dual-mode power amplifier is implemented according to an embodiment of the present disclosure.

FIG. 18 is a diagram for explaining a PCB on which a dual-mode power amplifier is implemented according to an embodiment of the present disclosure.

As shown in FIG. 18, an MMIC chip implementing the high-power amplifier 120 and the low-power amplifier 130 may be mounted on a PCB, and the input transformer 110, the first transformer 140, and the second transformer 150 may be implemented in a microstrip pattern around the MMIC.

Hereinafter, the output and efficiency of the dual-mode power amplifier 100 will be described with reference to the drawings.

Figure 19:
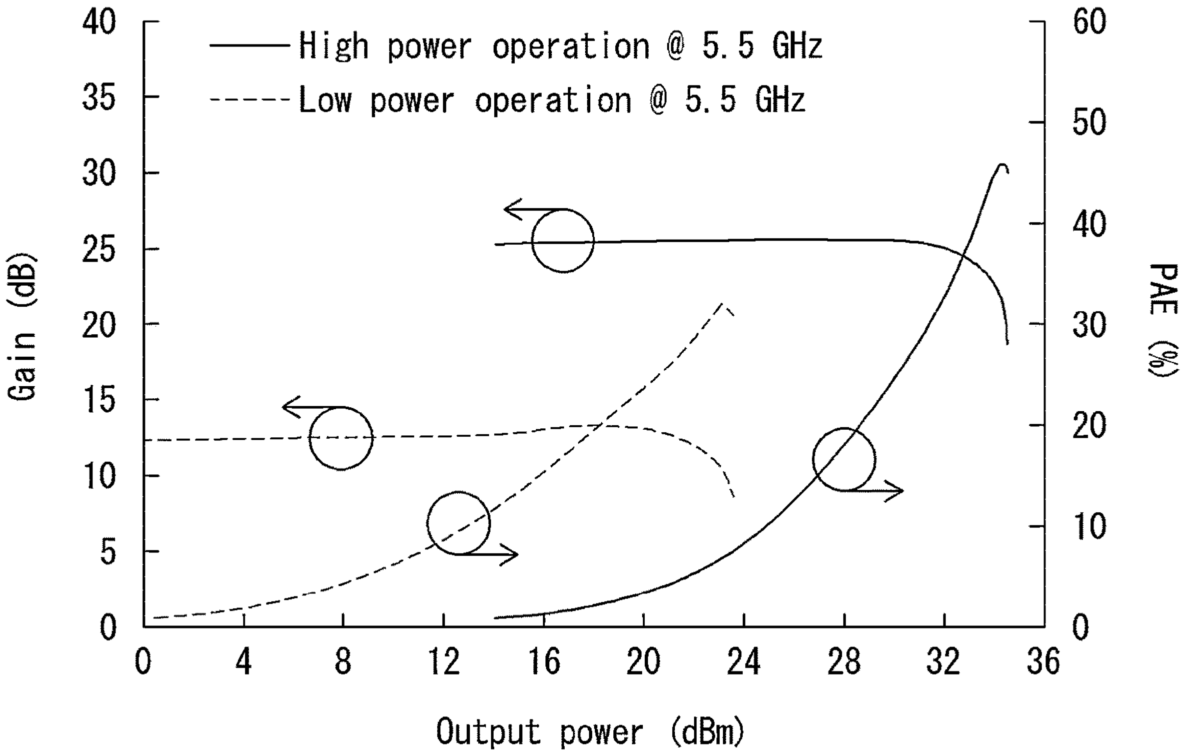
FIG. 19 is a graph for explaining the output and efficiency of a dual-mode power amplifier according to an embodiment of the present disclosure.

FIG. 19 is a graph explaining the output and efficiency of a dual-mode power amplifier according to an embodiment of the present disclosure.

As shown in FIG. 19, the graph shows a result of measuring a dual mode using a continuous wave (CW) signal at a center frequency of 5.5 [GHz].

When operating in a low-power mode, the low-power amplifier 130 may operate at a constant output gain from 0 to 20 [dBm], and operate in a direction that also increases power added efficiency (PAE).

When operating in a low-power mode, the high-power amplifier 120 may operate at a constant output gain from 14 to 32 [dBm], and operate in a direction that also increases PAE.

That is, the high-power amplifier 120 may maintain a constant higher output gain than the low-power amplifier 130.

It will be understood by those skilled in the art that various modifications may be made thereto without departing from the gist of the present disclosure. Therefore, it should be noted that the methods disclosed herein are merely illustrative but not restrictive to the concept of the present disclosure. The scope of the present disclosure is defined by the appended claims rather than the detailed description, and all differences within the scope equivalent thereto should be construed as being included in the scope of the present disclosure.

DESCRIPTION OF SYMBOLS

100: Dual-mode power amplifier
110: Input transformer
120: High-power amplifier
130: Low-power amplifier
140: First transformer
150: Second transformer
160: Amplifier output stage

INDUSTRIAL APPLICABILITY

According to the present disclosure, it may be configured such that an impedance is matched to a high-power amplifier and an impedance close to infinity is shown at a low-power amplifier when operating in a high-power mode, and an impedance is matched to a low-power amplifier and an impedance close to infinity is shown at a high-power amplifier when operating in a low-power mode so as to achieve maximum output, thereby having high industrial applicability.

The invention claimed is:

1. A dual-mode power amplifier that can selectively operate in a low-power mode for low output and a high-power mode for high output, the dual-mode power amplifier comprising:

a high-power amplifier comprising one or more transistors whose operations are controlled by a first bias;

a first transformer connected in series to an output stage of the high-power amplifier;

a low-power amplifier comprising one or more transistors whose operations are controlled by a second bias; and a second transformer connected in series to an output stage of the low-power amplifier, wherein the dual-mode power amplifier operates in a high-power mode when the first bias is activated and the second bias is deactivated, wherein the dual-mode power amplifier operates in a low-power mode when the first bias is deactivated and the second bias is activated, wherein an inductance of a primary coil of the second transformer is determined by a series equivalent capacitor by which a parasitic capacitance of the low-power amplifier is replaced, and wherein an inductance of a primary coil of the first transformer is determined by a series equivalent capacitor by which a parasitic capacitance of the high-power amplifier is replaced.

2. The dual-mode power amplifier of claim 1, further comprising:

an input transformer, wherein the high-power amplifier is connected in series to an output stage of the input transformer, and wherein the low-power amplifier is connected in series to an output stage of the input transformer.

3. The dual-mode power amplifier of claim 1, wherein when operating in the high-power mode, the first transformer provides impedance matching to the high-power amplifier, and the second transformer provides an impedance with an infinite value to the low-power amplifier.

4. The dual-mode power amplifier of claim 1, wherein when operating in the low-power mode, the second transformer provides impedance matching to the low-power amplifier, and the first transformer provides an impedance with an infinite value to the high-power amplifier.

5. The dual-mode power amplifier of claim 1, wherein the inductance of the primary coil of the second transformer is calculated using the following equation $$L_{p2} = \frac{1}{\omega^2 C_{eq2}}$$

here, $L_{p2}$ is an inductance of the primary coil of the second transformer, ω is a frequency, and $C_{eq2}$ is a series equivalent capacitor by which the parasitic capacitance of the low-power amplifier is replaced.

6. The dual-mode power amplifier of claim 1, wherein the inductance of the primary coil of the first transformer is calculated using the following equation $$L_{p1} = \frac{1}{\omega^2 C_{eq1}}$$

here, $L_{p1}$ is an inductance of the primary coil of the first transformer, and $C_{eq2}$ is a series equivalent capacitor by which the parasitic capacitance of the high-power amplifier is replaced.

7. The dual-mode power amplifier of claim 1, wherein when operating in the high-power mode, an impedance seen from the high-power amplifier to an amplifier output stage of the dual-mode power amplifier is determined by the inductance of the primary coil of the first transformer, and an impedance seen from the amplifier output stage of the dual-mode power amplifier to the low-power amplifier is determined by an inductance of a secondary coil of the second transformer.

8. The dual-mode power amplifier of claim 7, wherein the secondary coil inductance of the second transformer is determined in a direction of increasing a magnitude of impedance seen from the amplifier output stage of the dual-mode power amplifier to the low-power amplifier when operating in the high-power mode.

9. The dual-mode power amplifier of claim 1, wherein when operating in the low-power mode, an impedance seen from the low-power amplifier to an amplifier output stage of the dual-mode power amplifier is determined by the inductance of the primary coil of the second transformer, and an impedance seen from the amplifier output stage of the dual-mode power amplifier to the high-power amplifier is determined by an inductance of a secondary coil of the first transformer.

10. The dual-mode power amplifier of claim 9, wherein the secondary coil inductance of the first transformer is determined in a direction of increasing a magnitude of impedance seen from an output stage of the first transformer to the high-power amplifier when operating in the low-power mode.

11. The dual-mode power amplifier of claim 7, further comprising:

a first front-end capacitor connected in parallel to a front end of the first transformer;

a first rear-end capacitor connected in parallel to a rear end of the first transformer;

a second front-end capacitor connected in parallel to a front end of the second transformer; and a second rear-end capacitor connected in parallel to a rear end of the second transformer, wherein the first rear-end capacitor and the second rear-end capacitor share the same capacitor.

12. The dual-mode power amplifier of claim 11, wherein when operating in the high-power mode, an impedance seen from the high-power amplifier to the amplifier output stage of the dual-mode power amplifier is determined by further including a capacitance of the first front-end capacitor, and an impedance seen from the amplifier output stage to the low-power amplifier is determined by further including a capacitance of the second rear-end capacitor.

13. The dual-mode power amplifier of claim 12, wherein when operating in the low-power mode, an impedance seen from the low-power amplifier to the amplifier output stage of the dual-mode power amplifier is determined by further including a capacitance of the second front-end capacitor, and an impedance seen from the amplifier output stage of the dual-mode power amplifier to the high-power amplifier is determined by further including a capacitance of the first rear-end capacitor.

14. The dual-mode power amplifier of claim 1, wherein when operating in the high-power mode, the high-power amplifier adjusts a turns ratio of the first transformer and an inductance of the primary coil of the first transformer to match an impedance seen from the high-power amplifier to an amplifier output stage of the dual-mode power amplifier with a load, and the low-power amplifier adjusts an inductance of the primary coil of the second transformer to minimize an imaginary component of the impedance of the low-power amplifier, and generate an infinite impedance seen from the amplifier output stage of the dual-mode power amplifier to the low-power amplifier.

15. The dual-mode power amplifier of claim 1, wherein when operating in the low-power mode, the high-power amplifier adjusts an inductance of the primary coil of the first transformer to minimize an imaginary component of the impedance of the high-power amplifier and generate an infinite impedance seen from an amplifier output stage of the dual-mode power amplifier to the high-power amplifier, and the low-power amplifier adjusts a turns ratio of the second transformer and an inductance of the primary coil of the second transformer to match an impedance seen from the low-power amplifier to the amplifier output stage of the dual-mode power amplifier with a load.

16. The dual-mode power amplifier of claim 1, wherein when operating in the high-power mode, an output impedance of the high-power amplifier moves from an impedance seen from the secondary coil of the first transformer to an amplifier output stage of the dual-mode power amplifier toward an impedance seen from the primary coil of the first transformer to the amplifier output stage.

17. The dual-mode power amplifier of claim 1, wherein when operating in the low-power mode, for the second transformer, an output impedance of the low-power amplifier moves from an impedance seen from the secondary coil of the second transformer to an amplifier output stage of the dual-mode power amplifier toward an impedance seen from the primary coil of the second transformer to the amplifier output stage.

18. The dual-mode power amplifier of claim 1, wherein the high-power amplifier and the low-power amplifier are implemented in a single MMIC using an InGaP/GaAs HBT process.

19. The dual-mode power amplifier of claim 18, wherein the first transformer and the second transformer are implemented as a microstrip pattern around the MMIC on a PCB on which the MMIC is mounted.

* * * * *